(12) United States Patent
Suzuki et al.

(10) Patent No.: US 8,760,381 B2
(45) Date of Patent: Jun. 24, 2014

(54) DISPLAY DEVICE AND DRIVING METHOD

(75) Inventors: Toshiaki Suzuki, Kanagawa (JP); Tsuyoshi Kamada, Kanagawa (JP); Yuji Nakahata, Kanagawa (JP); Makoto Nakagawa, Tokyo (JP)

(73) Assignee: Sony Corporation, Tokyo (JP)

( * ) Notice: Subject to any disclaimer, the term of this patent is extended or adjusted under 35 U.S.C. 154(b) by 246 days.

(21) Appl. No.: 12/927,773

(22) Filed: Nov. 23, 2010

(65) Prior Publication Data

US 2011/0128259 A1   Jun. 2, 2011

(30) Foreign Application Priority Data

Dec. 1, 2009   (JP) ................................. P2009-273721

(51) Int. Cl.
*G09G 5/00* (2006.01)
*G09G 3/36* (2006.01)

(52) U.S. Cl.
CPC .................................... *G09G 3/3677* (2013.01)
USPC .......................................... 345/100; 377/64

(58) Field of Classification Search
CPC .................................................. G09G 3/3677
USPC ........... 345/38, 42, 50, 51, 55, 56, 61, 87, 90, 345/92, 93, 98, 99, 100, 103, 104, 204, 205, 345/206, 214; 377/64
See application file for complete search history.

(56) References Cited

U.S. PATENT DOCUMENTS

| | | | | |
|---|---|---|---|---|
| 5,568,163 | A * | 10/1996 | Okumura ....................... | 345/100 |
| 6,542,139 | B1 * | 4/2003 | Kanno ............................. | 345/87 |
| 6,903,716 | B2 * | 6/2005 | Kawabe et al. ................. | 345/99 |
| 6,920,416 | B1 * | 7/2005 | Swoboda et al. ............... | 703/13 |
| 7,042,426 | B2 * | 5/2006 | Shin .............................. | 345/76 |
| 2006/0139294 | A1 * | 6/2006 | Tanaka et al. ................. | 345/100 |
| 2006/0221041 | A1 * | 10/2006 | Cho et al. ...................... | 345/100 |
| 2007/0038909 | A1 * | 2/2007 | Kim et al. ..................... | 714/726 |
| 2007/0070020 | A1 * | 3/2007 | Edo et al. ...................... | 345/100 |
| 2007/0104307 | A1 * | 5/2007 | Kim et al. ....................... | 377/64 |
| 2007/0195920 | A1 * | 8/2007 | Tobita ............................. | 377/64 |
| 2008/0224985 | A1 * | 9/2008 | Jang .............................. | 345/100 |

* cited by examiner

*Primary Examiner* — Quan-Zhen Wang
*Assistant Examiner* — Michael J Eurice
(74) *Attorney, Agent, or Firm* — Sony Corporation of America

(57) ABSTRACT

There is provided a display device including an array substrate including pixels arranged in a matrix manner and gate control circuits that scan gate lines of the pixels and that are provided on the array substrate such that the gate control circuits correspond to the respective gate lines of the pixels. Each of the gate control circuits includes a first output terminal that outputs a signal to each of the gate lines, and a second output terminal that outputs a signal that is supplied to a gate control circuit in a subsequent stage. When adjacent two of the gate lines are scanned simultaneously from an upper part of a screen by the signal output from the first output terminal of each of the gate control circuits, a gate on period is provided during which outputs from the first output terminals of adjacent two of the gate control circuits are the same.

11 Claims, 17 Drawing Sheets

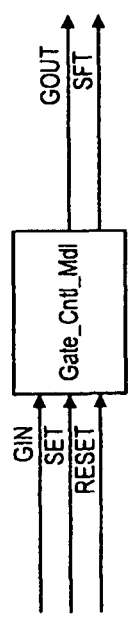
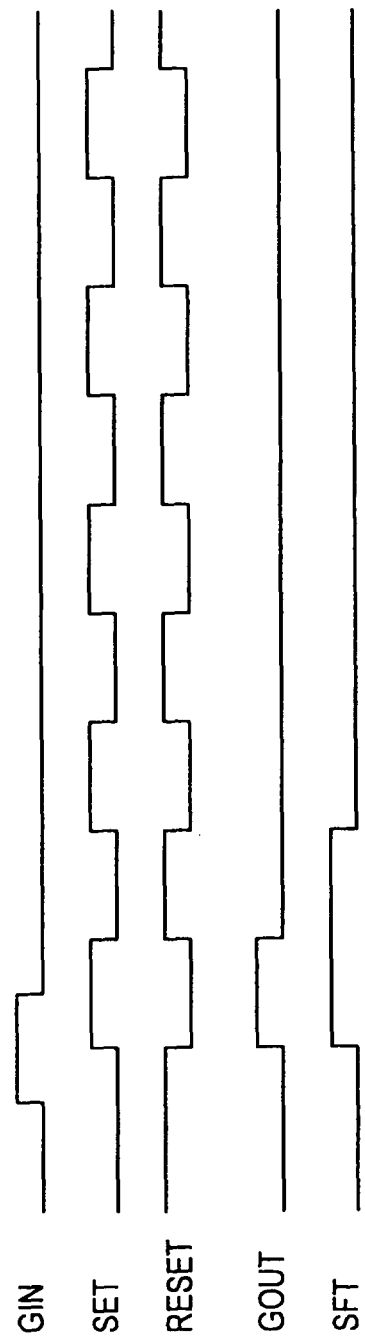
FIG. 3A
FIG. 3B

DISPLAY DEVICE AND DRIVING METHOD

CROSS-REFERENCE TO RELATED APPLICATION

The present application claims priority from Japanese Patent Application No. JP 2009-273721 filed in the Japanese Patent Office on Dec. 1, 2009, the entire content of which is incorporated herein by reference.

BACKGROUND OF THE INVENTION

1. Field of the Invention

The present invention relates to a display device and a driving method.

2. Description of the Related Art

In liquid crystal display devices, in some cases, the function of a gate driver is provided as an amorphous silicon ($\alpha$-Si) circuit on an array substrate.

SUMMARY OF THE INVENTION

However, in known art, a shift register of a gate control circuit corresponding to one horizontal line is connected by skipping two connection cycles, and a certain horizontal line and the preceding or subsequent horizontal line of the certain horizontal line cannot be simultaneously turned on. In normal image scanning that is performed for each horizontal line (i.e., line-by-line scanning), although it is possible to simultaneously turn on a plurality of gate lines, gates for determining pixel data writing are turned on line by line.

A technique is known in which, when a stereoscopic three-dimensional video image is displayed on a liquid crystal display device, an image for a right eye and an image for a left eye are consecutively written to a liquid crystal panel a predetermined number of times (for example, twice). Further, a technique is known in which, in order to write the image for the right eye and the image for the left eye twice consecutively to a liquid crystal panel with a drive frequency of 120 Hz, the same data is written to odd-numbered lines and even-numbered lines of the liquid crystal panel, thus achieving consecutive writing of the image for the right eye and the image for the left eye.

In this type of case in which the shift register of the gate control circuit is not connected to an adjacent gate line, two gate lines that are adjacent to each other can be turned on simultaneously. However, in this case, it is difficult for the two gate lines that are turned on simultaneously to have the same gate on characteristics. A difference between the gates on characteristics of the two gate lines appears as a gate on time interval. As a result, writing time is not sufficient between adjacent horizontal lines, and there is a writing difference where writing characteristics are not saturated, leading to the occurrence of display unevenness in the form of lateral stripes. In addition, it is not a reliable gate scanning method in terms of performance assurance because the drive is performed in a fundamentally different way from the normal drive.

In light of the foregoing, it is desirable to provide a new and improved display device and driving method that allow scanning of each horizontal line as well as simultaneous scanning of two horizontal lines, and that are capable of suppressing occurrence of display unevenness in the form of lateral stripes due to a writing difference, by causing adjacent horizontal lines to have same gate on characteristics and by securing a sufficient writing time when the two horizontal lines are simultaneously scanned.

According to an embodiment of the present invention, there is provided a display device including an array substrate including pixels arranged in a matrix manner and gate control circuits that scan gate lines of the pixels and that are provided on the array substrate such that the gate control circuits correspond to the respective gate lines of the pixels. Each of the gate control circuits includes a first output terminal that outputs a signal to each of the gate lines, and a second output terminal that outputs a signal that is supplied to a gate control circuit in a subsequent stage. When adjacent two of the gate lines are scanned simultaneously from an upper part of a screen by the signal output from the first output terminal of each of the gate control circuits, a gate on period is provided during which outputs from the first output terminals of adjacent two of the gate control circuits are the same.

The gate control circuit may include a shift register which transfers, at a rising edge of a set signal, a level of an input signal to the outputs from the first output terminal and the second output terminal, and which causes the output from the first output terminal to have a low level at a rising edge of a reset signal.

A connection cycle of the gate control circuits may be equal to or more than a product of a number of lines corresponding to a selection time of each of the gate lines and a number of lines that are simultaneously selected.

A connection cycle of the gate control circuits may be an even number. And, the connection cycle of the gate control circuits may be every six stages and, when adjacent two of the gate lines are simultaneously scanned, an on period of each of the gate lines may be three lines.

A gate on period is provided during which an output from the first output terminal of each of the gate control circuits when the gate lines are scanned line by line from the upper part of the screen by the signal output from the first output terminal of each of the gate control circuits may be the same as an output from the first output terminal when adjacent two of the gate lines are simultaneously scanned from the upper part of the screen.

The display device may further include a first selector circuit that switches a supply destination of the signal from the second output terminal depending on whether the gate lines are scanned line by line from the upper part of the screen or two of the gate lines are scanned simultaneously from the upper part of the screen. Due to the switching performed by the first selector circuit, a gate on period is provided during which the output from the first output terminal of each of the gate control circuits when the gate lines are scanned line by line from the upper part of the screen may be the same as the output from the first output terminal when adjacent two of the gate lines are scanned simultaneously from the upper part of the screen.

The display device may further include a second selector circuit that switches a supply destination of the signal that is supplied to each of the gate control circuits depending on whether the gate lines are scanned line by line from the upper part of the screen or adjacent two of the gate lines are scanned simultaneously from the upper part of the screen. Due to the switching performed by the first selector circuit and the second selector circuit, a gate on period is provided during which the output from the first output terminal of each of the gate control circuits when the gate lines are scanned line by line from the upper part of the screen may be the same as the output from the first output terminal when adjacent two of the gate lines are scanned simultaneously from the upper part of the screen.

The display device may further include a logical circuit including an AND circuit that calculates and outputs a logical product of the set signal and a logical product of the reset signal, and a third selector circuit that switches a supply destination of the signal to each of the gate control circuits such that, when the gate lines are scanned line by line from the upper part of the screen, the logical product of the reset signal is supplied to each of the gate control circuits and, when adjacent two of the gate lines are scanned simultaneously from the upper part of the screen, the logical product of the set signal is supplied to each of the gate control circuits.

According to another embodiment of the present invention, there is provided a driving method for a display device, including the steps of in a display device including an array substrate including pixels arranged in a matrix manner, and gate control circuits that scan gate lines of the pixels and that are provided on the array substrate such that the gate control circuits correspond to the respective gate lines of the pixels, each of the gate control circuits including a first output terminal that outputs a signal to each of the gate lines, and a second output terminal that outputs a signal that is supplied to a gate control circuit in a subsequent stage, outputting, from the first output terminal of each of the gate control circuits, when adjacent two of the gate lines are scanned simultaneously from an upper part of a screen, a signal having a gate on period during which outputs from the first output terminals of adjacent two of the gate control circuits are the same.

According to the embodiments of the present invention described above, it is possible to provide a new and improved display device and driving method that allow scanning of each horizontal line as well as simultaneous scanning of two horizontal lines, and that are not only capable of suppressing display unevenness due to insufficient writing to a pixel array and of eliminating a difference in writing time, but also capable of securing sufficient gate on time, by causing adjacent horizontal lines to have same gate on characteristics when the two horizontal lines are simultaneously scanned.

BRIEF DESCRIPTION OF THE DRAWINGS

FIG. 3 is a diagram showing an operation manner of a gate control circuit;

DETAILED DESCRIPTION OF THE EMBODIMENT

Figure 1:
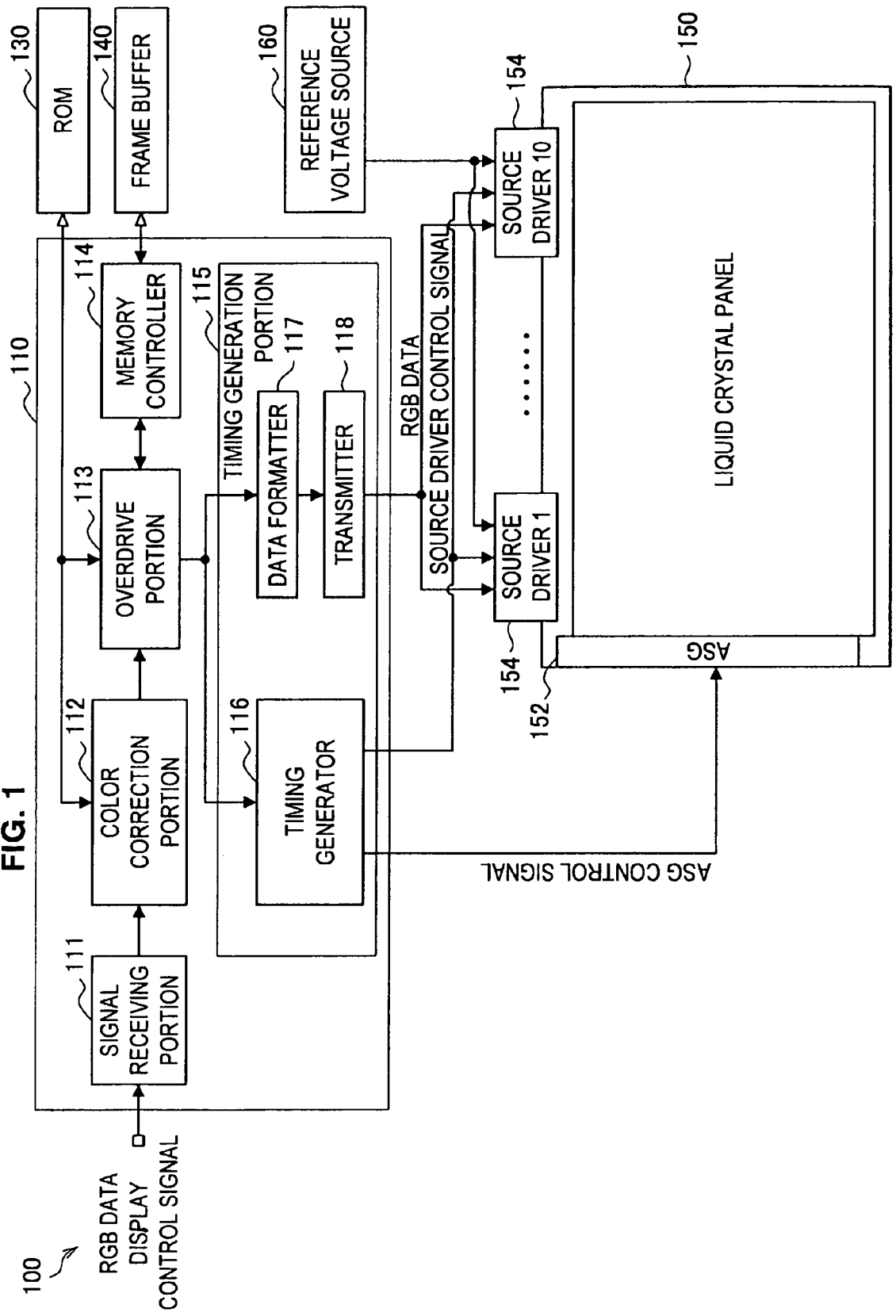
FIG. 1 is an explanatory diagram showing a structure of a liquid crystal display device 100 according to an embodiment of the present invention.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

Note that the description will be given in the order shown below.

1. Embodiment of the present invention
1-1. Structure of liquid crystal display device
1-2. First structural example of ASG
1-3. Second structural example of ASG
1-4. Third structural example of ASG
1-5. Fourth structural example of ASG
1-6. Fifth structural example of ASG
2. Conclusion 1. Embodiment of the Present Invention 1-1. Structure of Liquid Crystal Display Device First, the structure of a liquid crystal display device according to an embodiment of the present invention will be described. FIG. 1 is an explanatory diagram showing the structure of a liquid crystal display device 100 according to the embodiment of the present invention. Hereinafter, the structure of the liquid crystal display device 100 according to the embodiment of the present invention will be described with reference to FIG. 1.

As shown in FIG. 1, the liquid crystal display device 100 according to the embodiment of the present invention includes a controller 110, a ROM 130, a frame buffer 140, a liquid crystal panel 150 and a reference voltage source 160.

The controller 110 generates a signal that controls drive of the liquid crystal panel 150 using a video signal. As shown in FIG. 1, the controller 110 includes a signal receiving portion 111, a color correction portion 112, an overdrive portion 113, a memory controller 114 and a timing generation portion 115.

The signal receiving portion 111 receives a video signal (RGB data) that is supplied to the controller 110, and a display control signal that controls drive of the liquid crystal panel 150. The video signal and the display control signal received by the signal receiving portion 111 are supplied to the color correction portion 112. The color correction portion 112 performs correction processing, with respect to a color gamma characteristic, on the video signal supplied from the signal receiving portion 111. The color gamma correction processing in the color correction portion 112 is performed based on color gamma characteristic correction information recorded in the ROM 130. The video signal that has undergone the color gamma correction in the color correction portion 112 is then supplied to the overdrive portion 113.

The overdrive portion 113 performs overdrive processing on an image signal. More specifically, the overdrive portion 113 performs signal conversion in accordance with a combination of an image for which frame delay has been set via the frame buffer 140 and an image with no delay that is supplied from the color correction portion 112. The video signal that has undergone the signal conversion processing in the overdrive portion 113 is supplied to the timing generation portion 115. The memory controller 114 controls reading and writing of video signals from and to the frame buffer 140 that is connected to the controller 110.

The timing generation portion 115 receives the video signal that has undergone the signal conversion processing in the overdrive portion 113, converts the supplied video signal, and then supplies the converted video signal to the liquid crystal panel 150. The timing generation portion 115 includes a timing generator 116, a data formatter 117 and a transmitter 118.

The timing generator 116 supplies an amorphous silicon gate-IC (ASG) 152 (which will be described later) with an ASG control signal for scanning horizontal lines of the liquid crystal panel 150. Further, the timing generator 116 supplies the source driver 154 (which will be described later) with a source driver control signal that controls the polarity of electric potential and the level conversion when writing is performed to each of pixels arranged in a matrix on the liquid crystal panel 150.

The data formatter 117 converts an array of RGB data in accordance with a transmission system of the source driver 154 (which will be described later). The RGB data for which the array has been converted by the data formatter 117 is transmitted to the transmitter 118. When the transmitter 118 receives the RGB data supplied from the data formatter 117, it transfers an RGB data signal in accordance with the transmission system of the source driver 154 (which will be described later).

The ROM 130 stores various types of parameters that are used for the color gamma correction processing in the color correction portion 112 and for the overdrive processing in the overdrive portion 113. The frame buffer 140 temporarily stores image information in units of video frames. For example, a synchronous dynamic random access memory (SDRAM) may be used as the frame buffer 140. The memory controller 114 controls reading and writing, to and from the frame buffer 140, of the image information stored in the frame buffer 140.

The liquid crystal panel 150 controls image display using a liquid crystal. The liquid crystal panel 150 includes the ASG 152 and the source driver 154. The ASG 152 is an example of an integrated circuit (IC) that is formed such that a scanning circuit is built into an array substrate of a liquid crystal display device. The ASG 152 is a circuit formed on the liquid crystal panel 150, and it switches on a thin film transistor (TFT) (not shown in the figures) in units of horizontal lines, in accordance with a signal supplied from the timing generator 116. The TFT is provided in each of pixels arranged in a pixel array of the liquid crystal panel 150. The source driver 154 supplies an electric potential corresponding to display data, to the pixels on the horizontal line that is selected in the ASG 152. The electric potential supplied by the source driver 154 is supplied from the reference voltage source 160.

The liquid crystal display device 100 according to the embodiment of the present invention is described above. Key features of the liquid crystal display device 100 according to the embodiment of the present invention are that: the liquid crystal display device 100 allows scanning of each horizontal line as well as simultaneous scanning of two horizontal lines, by devising the structure of the ASG 152; and that, when the two horizontal lines are scanned simultaneously, the liquid crystal display device 100 causes adjacent horizontal lines to have the same gate on characteristics.

Figure 2:
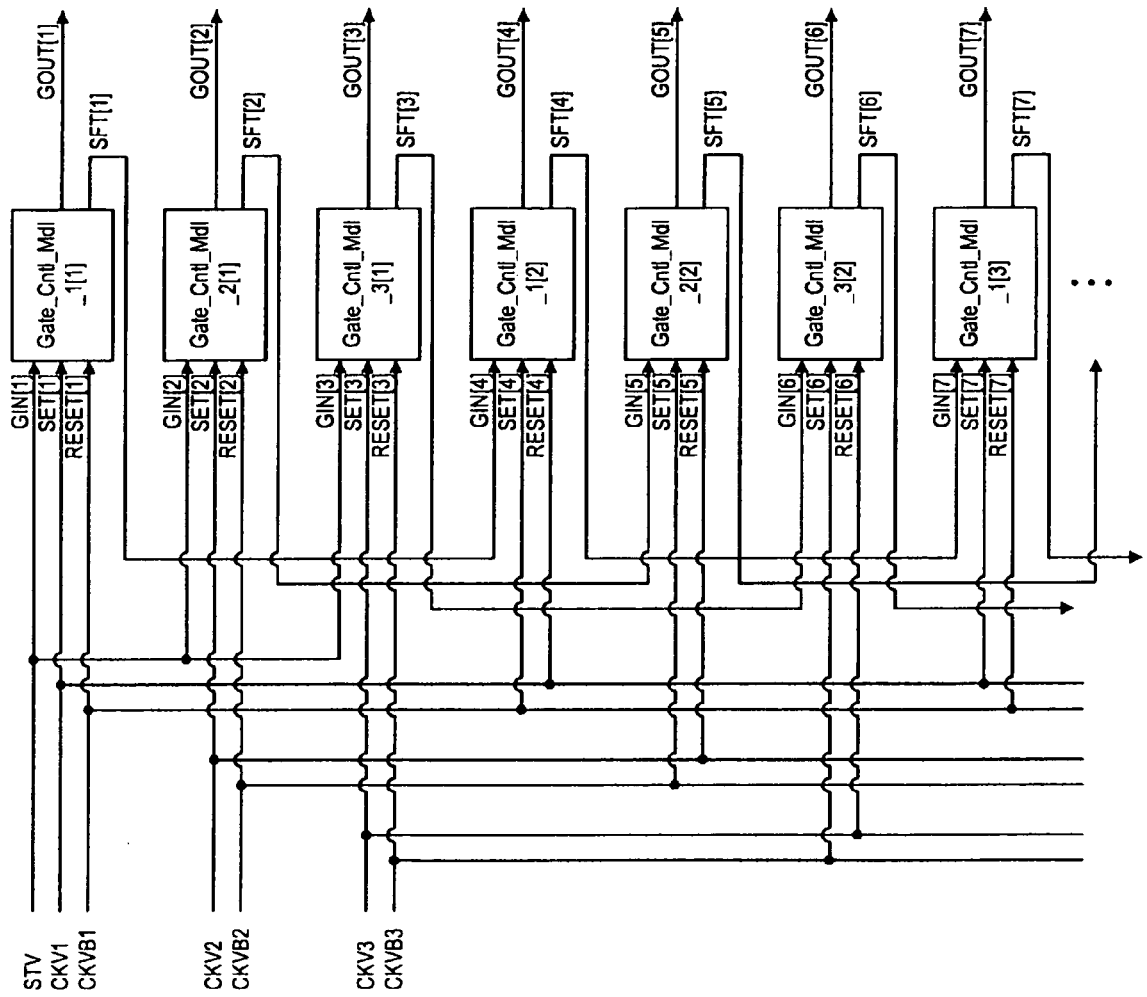
FIG. 2 is an explanatory diagram showing a first structural example of an ASG 152 according to the embodiment of the present invention.

Next, the structure of the ASG 152 according to the embodiment of the present invention will be described using examples. FIG. 2 is an explanatory diagram showing a first structural example of the ASG 152 according to the embodiment of the present invention. Hereinafter, the first structural example of the ASG 152 according to the embodiment of the present invention will be described with reference to FIG. 2.

1-2. First Structural Example of ASG

As shown in FIG. 2, the ASG 152 according to the embodiment of the present invention includes a plurality of gate control circuits Gate_Cntl_Mdl_m [n]. Hereinafter, each of the gate control circuits is also simply referred to as Gate_Cntl_Mdl. FIG. 2 shows seven gate control circuits (a gate control circuit Gate_Cntl_Mdl_1 [1] to a gate control circuit Gate_Cntl_Mdl_1 [3]). Each of the gate control circuits is a circuit that includes a one stage shift register that drives one gate line, and an output buffer. Each of the gate control circuits is cascade connected at every three cycles to the gate control circuit having the same m value. More specifically, an output of the gate control circuit Gate_Cntl_Mdl_1 [1] is cascade connected to the gate control circuit Gate_Cntl_Mdl_1 [2], and an output of the gate control circuit Gate_Cntl_Mdl_1 [2] is cascade connected to the gate control circuit Gate_Cntl_Mdl_1 [3].

Three types of signal, GIN, SET and RESET, which are generated by the timing generator 116, are supplied to each of the gate control circuits Gate_Cntl_Mdl. Each of the gate control circuits Gate_Cntl_Mdl outputs two types of signal, GOUT and SFT, in accordance with the state of the signals GIN, SET and RESET. The signal GOUT output from each of the gate control circuits Gate_Cntl_Mdl is supplied to each gate line, and the signal SFT output from each of the gate control circuits Gate_Cntl_Mdl is supplied as the signal GIN of the gate control circuit of a subsequent stage. FIG. 3 is a diagram showing an operation manner of each of the gate control circuits Gate_Cntl_Mdl. FIG. 3A shows an input-output relationship of the gate control circuit Gate_Cntl_Mdl, while FIG. 3B shows, in time series, the state of the input signals GIN, SET and RESET and the state of the output signals GOUT and SFT.

The gate control circuit Gate_Cntl_Mdl retrieves the level of the input signal GIN when the input signal SET is in a high state. The level of the input signal GIN is reflected on the level of the output signals GOUT and SFT that are output from the gate control circuit Gate_Cntl_Mdl. In the gate control circuit Gate_Cntl_Mdl, when the input signal RESET changes to a high state, the output signal GOUT changes to a low level. At this time, the output signal SFT is not affected by the input signal RESET.

Figure 4:
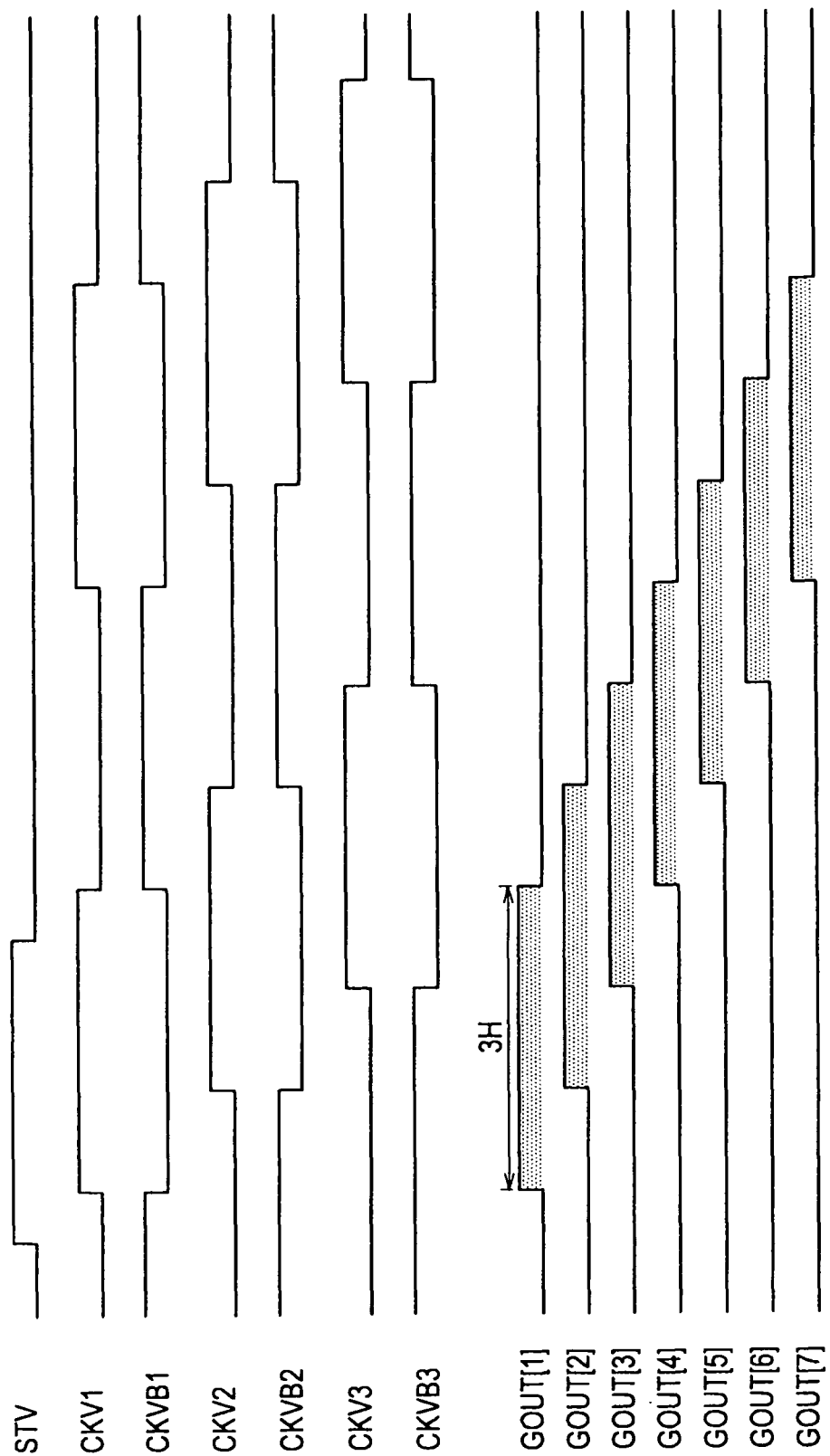
FIG. 4 is an explanatory diagram showing operation timings when scanning is performed line by line from an upper part of a screen.
Figure 5:
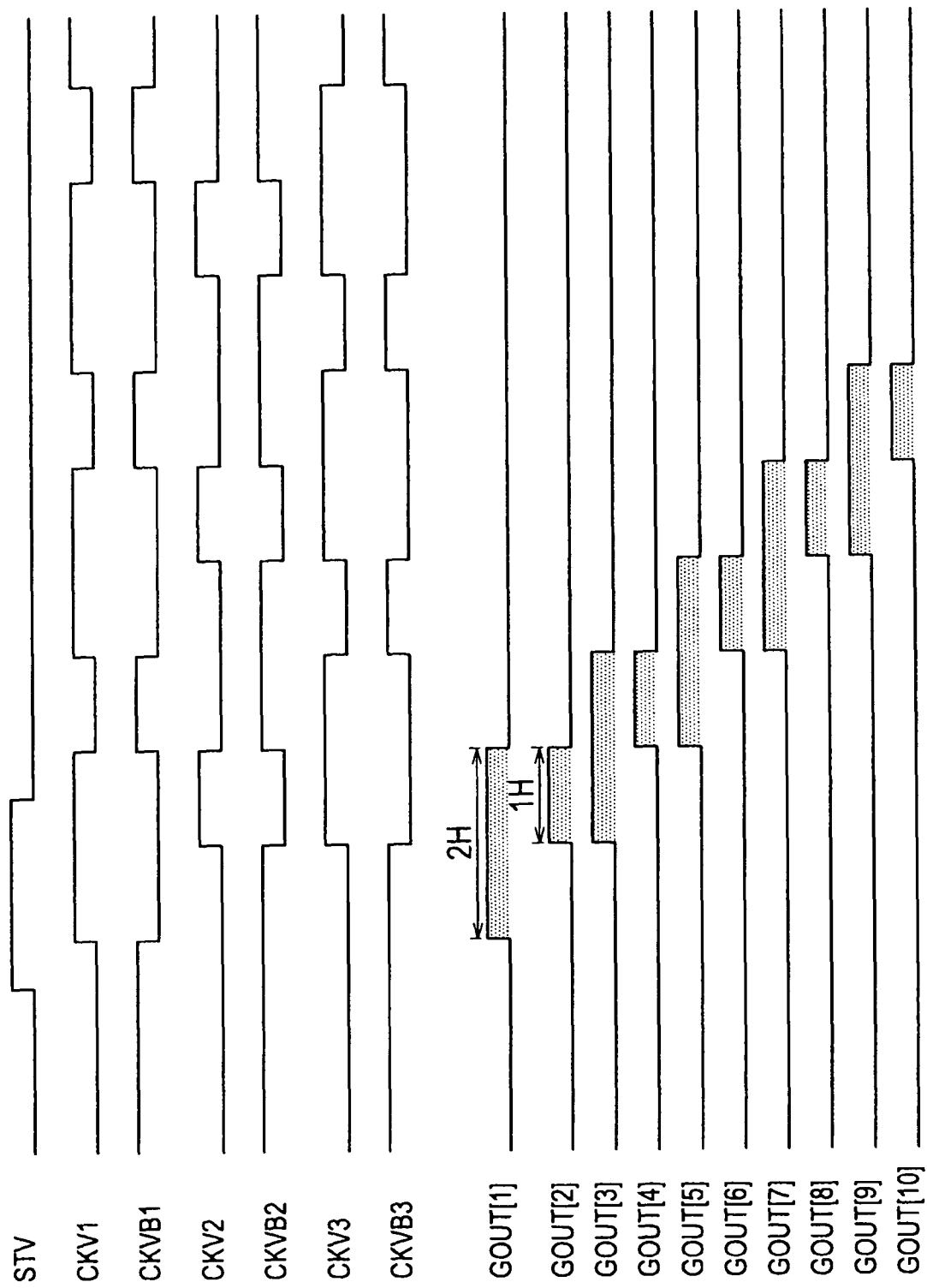
FIG. 5 is an explanatory diagram showing operation timings when scanning is performed from the upper part of the screen such that two lines are scanned simultaneously.

FIG. 4 and FIG. 5 are explanatory diagrams showing operation timings when scanning conditions are respectively changed in the ASG 152 shown in FIG. 2. FIG. 4 is an explanatory diagram showing operation timings when scanning is performed line by line from an upper part of a screen. FIG. 5 is an explanatory diagram showing operation timings when scanning is performed from the upper part of the screen such that two lines are scanned simultaneously. The signals shown in these figures are generated by the timing generator 116 and supplied to the ASG 152.

First, the operation timings when scanning is performed line by line from the upper part of the screen will be described with reference to FIG. 4. The GIN input of the gate control circuit Gate_Cntl_Mdl_1 [1] is connected to STV, the SET [1] input is connected to CKV1, and the RESET [1] input is connected to CKVB1.

In this case, the level of STV that is supplied from the timing generator 116 is introduced to GOUT [1] and SFT [1] at the rising timing of CKV1, and the level of GOUT [1] and SFT [1] becomes high. After 3 H (a horizontal scanning period) has elapsed, CKV1 falls and CKVB1 rises. At this timing, the level of GOUT [1] becomes low and the gate is turned off. At this time, in the gate control circuit Gate_Cntl_Mdl_1 [2], because CKVB1 is connected to the SET [4] input and SFT [1] is connected to the GIN [4] input, respectively, GOUT [4] and SFT [4] are turned on. At a timing at which CKV1 next rises, because the level of STV is low, the level of SFT [1] becomes low.

A similar operation is sequentially performed also for the gate control circuit Gate_Cntl_Mdl_2 [1] and the gate control circuit Gate_Cntl_Mdl_3 [1] to which CKV2 and CKV3 that rise later than CKV1 are supplied from the timing generator 116. The type of operation shown in FIG. 4 is sequentially performed from the gate control circuit connected to the gate line on the upper part of the screen. Thus, a gate on operation of one horizontal line is sequentially performed with a width corresponding to three horizontal lines.

Next, FIG. 5 is used to explain the operation timings when scanning is performed from the upper part of the screen such that two lines are scanned simultaneously. At the rising timing of CKV1, the level of STV that is supplied from the timing generator 116 is introduced to GOUT [1] and SFT [1], and the level of GOUT [1] and SFT [1] becomes high. After 1 H from when the level of GOUT [1] and SFT [1] becomes high, in the gate control circuit Gate_Cntl_Mdl_2 [1], which is the next line following the gate control circuit Gate_Cntl_Mdl_1 [1], the level of STV is introduced to GOUT [2] at the rising timing of CKV2, and the level of GOUT [2] and SFT [2] becomes high.

After 2 H from when the level of GOUT [1] and SFT [1] becomes high, the level of GOUT [1] becomes low at the rising timing of CKVB1, and the gate of this line is turned off. Further, in the gate control circuit Gate_Cntl_Mdl_2 [1], the level of GOUT [2] becomes low at the rising timing of CKVB2 and the gate of this line is turned off. After 2 H from this time point, GOUT [1] and GOUT [2] shift to a low-level state. Due to the shift, writing of image data is completed for these two gate lines. In this manner, the same gate off time is provided for every two horizontal lines. Thus, writing of image data is completed in units of two horizontal lines and it is possible to perform two-line simultaneous scanning.

Note that, as shown in FIG. 5, because GOUT [1] and GOUT [2] respectively have a different SET input, their gate on periods are different such that the gate on period of the odd-numbered line is 2 H and the gate on period of the even-numbered line is 1 H. The gate on period of the even-numbered line is short (1 H), and there is therefore a possibility that image data is not sufficiently written on the gate line of the even-numbered line. In the next example, a case will be described in which the gate on period of the odd-numbered line is made the same as the gate on period of the even-numbered line when two lines are simultaneously scanned.

1-3. Second Structural Example of ASG

Figure 6:
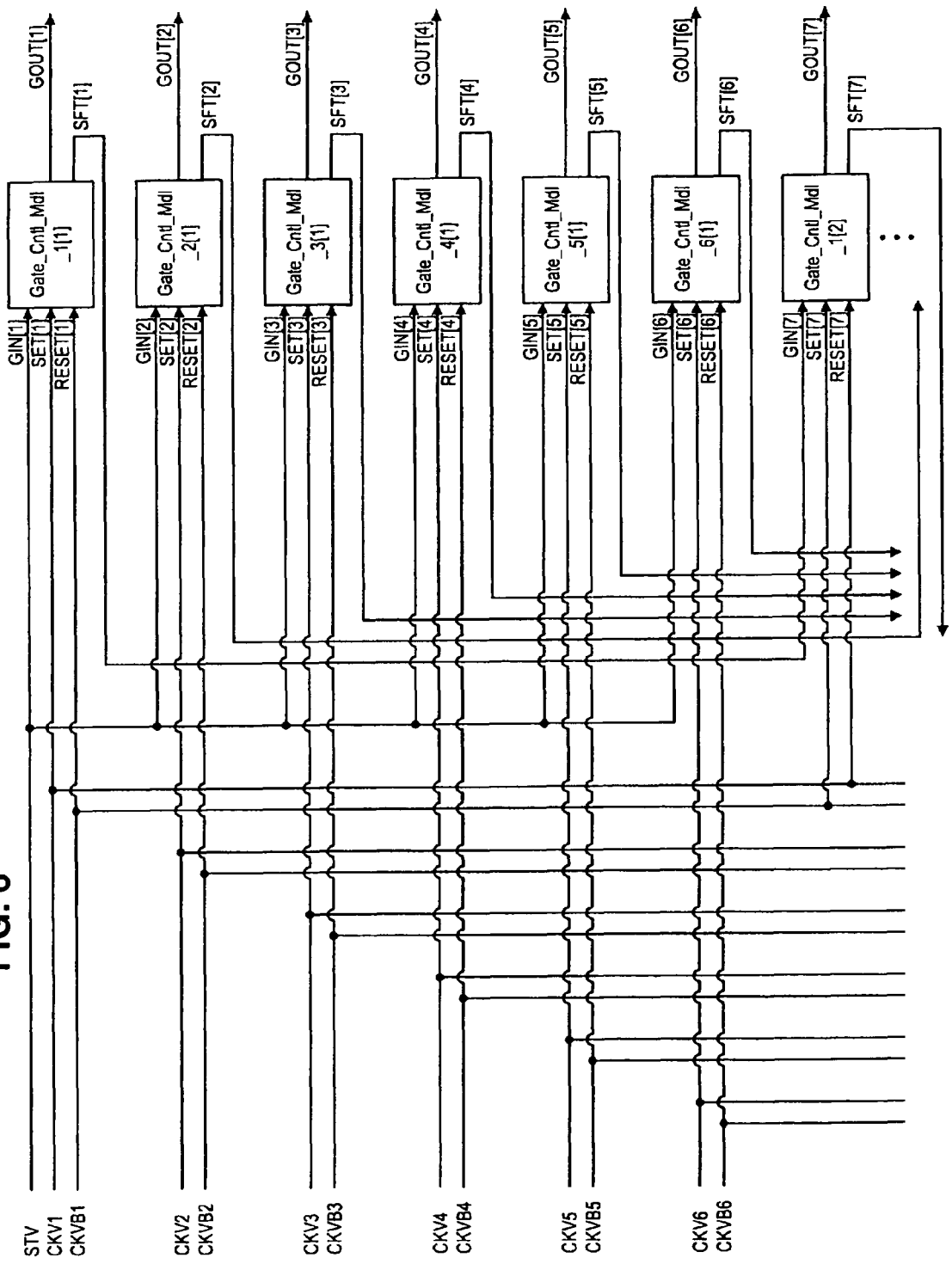
FIG. 6 is an explanatory diagram showing a second structural example of the ASG 152 according to the embodiment of the present invention.

FIG. 6 is an explanatory diagram showing a second structural example of the ASG 152 according to the embodiment of the present invention. Hereinafter, the second structural example of the ASG 152 according to the embodiment of the present invention will be described with reference to FIG. 6.

In a similar manner to FIG. 2, in this example, the ASG 152 includes a plurality of gate control circuits Gate_Cntl_Mdl_m [n]. FIG. 6 shows seven gate control circuits (the gate control circuit Gate_Cntl_Mdl_1 [1] to the gate control circuit Gate_Cntl_Mdl_1 [2]). Each of the gate control circuits is a circuit that includes a one stage shift register that drives one gate line, and an output buffer. Each of the gate control circuits is cascade connected at every six cycles to the gate control circuit having the same m value. More specifically, the output of the gate control circuit Gate_Cntl_Mdl_1 [1] is cascade connected to the gate control circuit Gate_Cntl_Mdl_1 [2] that corresponds to the sixth line from the gate control circuit Gate_Cntl_Mdl_1 [1].

In the same manner as each of the gate control circuits Gate_Cntl_Mdl shown in FIG. 2, three types of signals GIN, SET and RESET that are generated by the timing generator 116 are supplied to each of the gate control circuits Gate_Cntl_Mdl shown in FIG. 6. Each of the gate control circuits Gate_Cntl_Mdl outputs two types of signals GOUT and SFT in accordance with the state of the signals GIN, SET and RESET. The signal GOUT is supplied to each gate line, and the signal SFT is supplied as the signal GIN of the gate control circuit of a subsequent stage. The state of the input signals GIN, SET and RESET and the state of the output signals GOUT and SFT are the same as those shown in FIG. 3.

Figure 7:
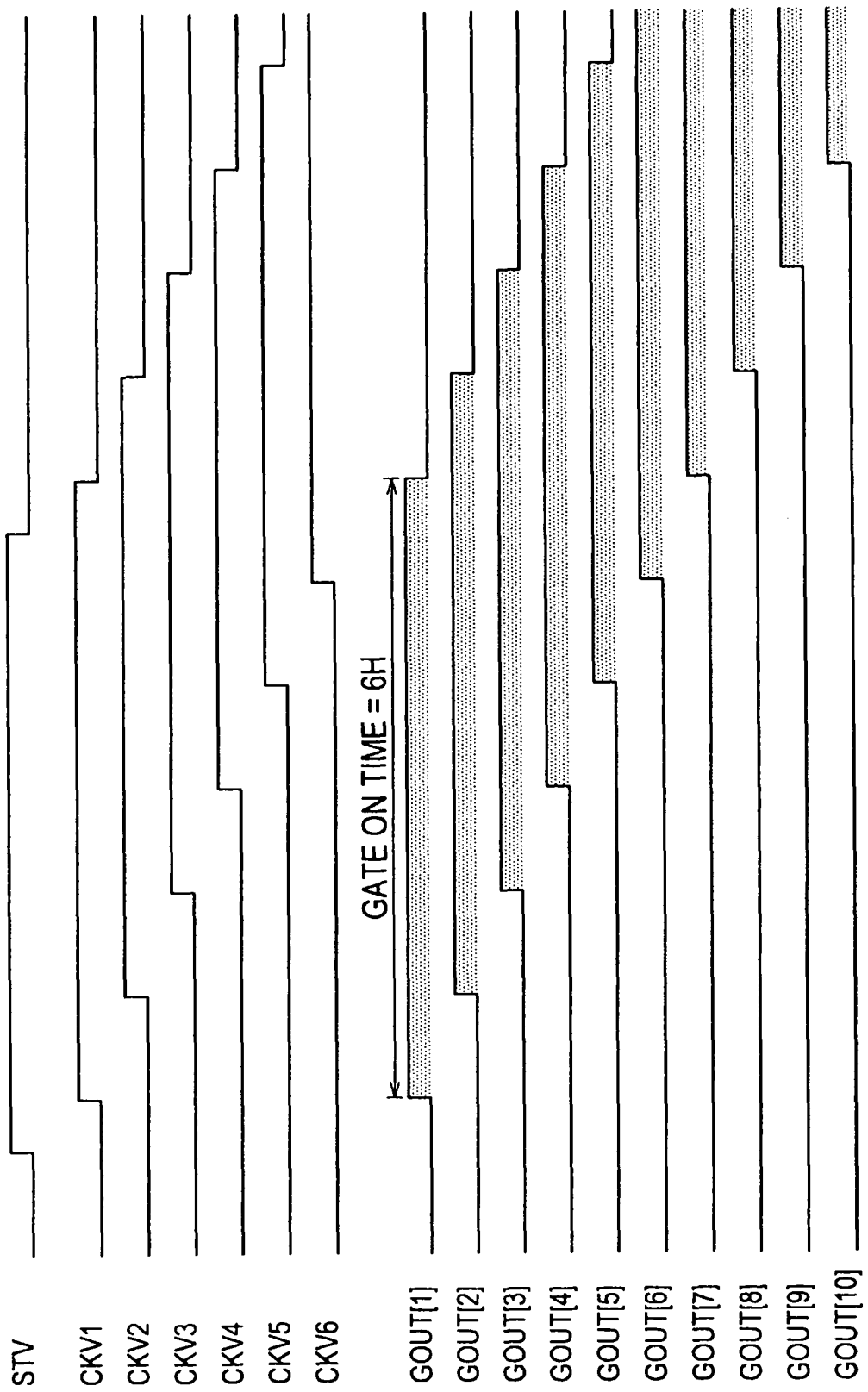
FIG. 7 is an explanatory diagram showing operation timings when scanning is performed line by line from the upper part of the screen.
Figure 8:
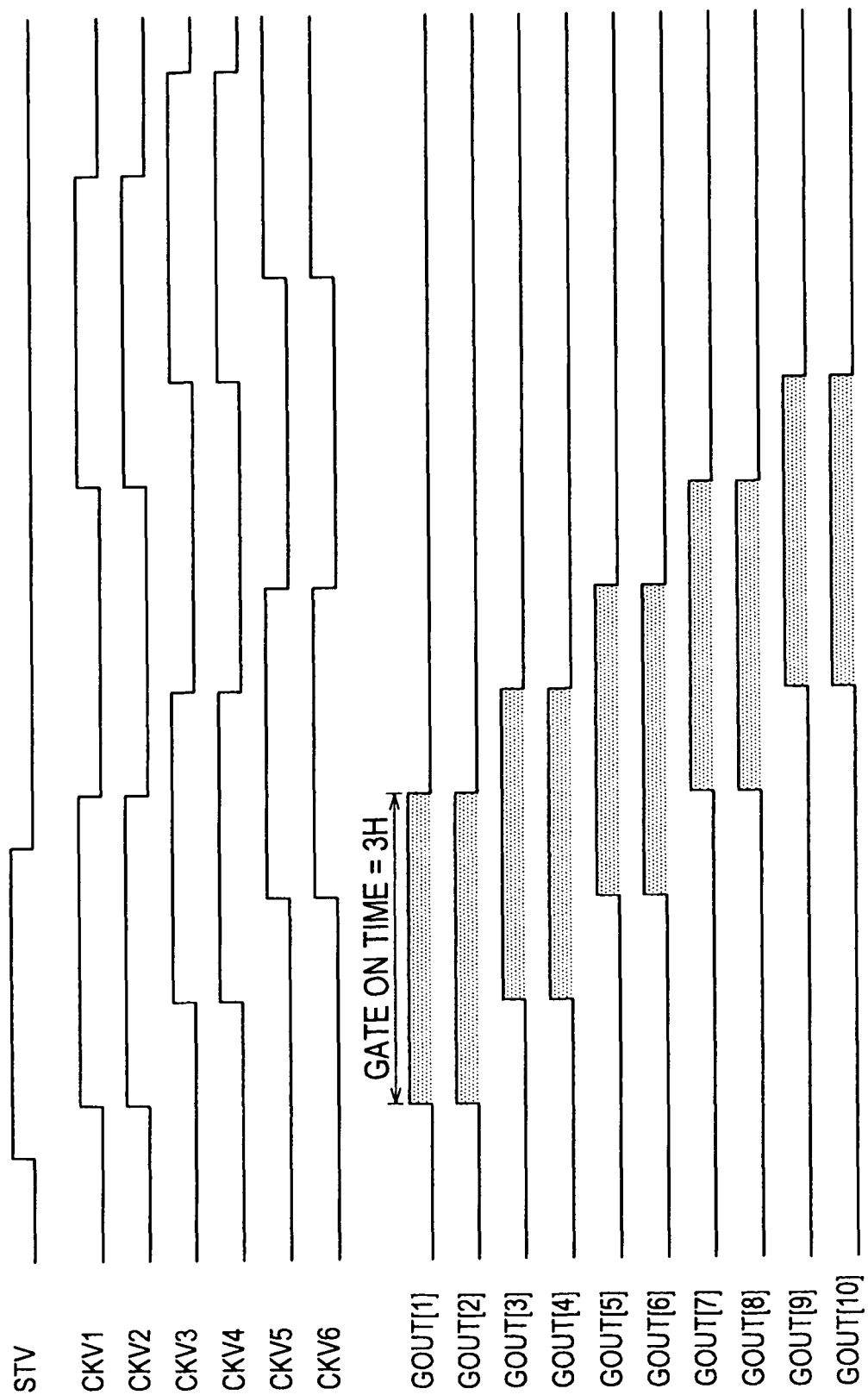
FIG. 8 is an explanatory diagram showing operation timings when scanning is performed from the upper part of the screen such that two lines are scanned simultaneously.

FIG. 7 and FIG. 8 are explanatory diagrams showing operation timings when scanning conditions are respectively changed in the ASG 152 shown in FIG. 6. FIG. 7 is an explanatory diagram showing operation timings when scanning is performed line by line from the upper part of the screen. FIG. 8 is an explanatory diagram showing operation timings when scanning is performed from the upper part of the screen such that two lines are scanned simultaneously. The signals shown in these figures are generated by the timing generator 116 and supplied to the ASG 152.

First, the operation timings when scanning is performed line by line from the upper part of the screen will be described with reference to FIG. 7. The GIN input of the gate control circuit Gate_Cntl_Mdl_1 [1] is connected to STV, the SET [1] input is connected to CKV1, and the RESET [1] input is connected to CKVB1. Note that CKVB1 to CKVB6 supplied to the gate control circuits Gate_Cntl_Mdl are reverse phase signals of CKV1 to CKV6, respectively, and they are omitted in FIG. 7.

In this case, the level of STV is introduced to GOUT [1] and SFT [1] at the rising timing of CKV1, and the level of GOUT [1] and SFT [1] becomes high. After 6 H (a horizontal scanning period) has elapsed, CKV1 falls and CKVB1 rises. At this timing, the level of GOUT [1] becomes low and the gate is turned off. At this time, in the gate control circuit Gate_Cntl_Mdl_1 [2], because CKVB1 is connected to the SET [7] input and SFT [1] is connected to the GIN [7] input, respectively, GOUT [7] and SFT [7] are turned on. At a timing at which CKV1 next rises, because the level of STV is low, the level of SFT [1] becomes low.

A similar operation is sequentially performed also for the gate control circuit Gate_Cntl_Mdl_2 [1], the gate control circuit Gate_Cntl_Mdl_3 [1] and the like, to which CKV2 and CKV3 that rise later than CKV1 are supplied from the timing generator 116. The type of operation shown in FIG. 7 is sequentially performed from the gate control circuit connected to the gate line on the upper part of the screen. Thus, a gate on operation of one horizontal line is sequentially performed with a width corresponding to six horizontal lines.

Next, FIG. 8 is used to explain the operation timings when scanning is performed from the upper part of the screen such that two lines are scanned simultaneously. At the rising timing of CKV1, the level of STV is introduced to GOUT [1] and SFT [1], and the level of GOUT [1] and SFT [1] becomes high. The level of STV is introduced to GOUT [2] and SFT [2] at the rising timing of CKV2 that rises at the same time as CKV1, and the level of GOUT [2] and SFT [2] becomes high.

After 3 H from when the level of GOUT [1] and SFT [1] becomes high, the level of GOUT [1] becomes low at the rising timing of CKVB1 and the gate of this line is turned off. Further, in the gate control circuit Gate_Cntl_Mdl_2 [1], the level of GOUT [2] becomes low at the rising timing of CKVB2, and the gate of this line is turned off. After 3 H from this time point, GOUT [1] and GOUT [2] shift to a low state. Due to the shift, writing of image data is completed for these two gate lines. In this manner, the same gate off time is provided for each two horizontal lines. Thus, writing of image data is completed in units of two horizontal lines and it is possible to perform two-line simultaneous scanning.

As shown in FIG. 8, in the second structural example of the ASG 152 according to the embodiment of the present invention, when two-line simultaneous scanning is performed, the gate on period of the odd-numbered line matches the gate on period of the even-numbered line. In the second structural example of the ASG 152 according to the embodiment of the present invention, because a 3 H gate on period is provided, writing of image data is sufficiently possible also on the even-numbered gate lines.

Note that, in the second structural example of the ASG 152, the gate on period when scanning is performed line by line from the upper part of the screen is different from the gate on period when scanning is performed from the upper part of the screen such that two lines are scanned simultaneously. As shown in FIG. 7 and FIG. 8, the gate on period when scanning is performed line by line from the upper part of the screen is 6 H, and the gate on period when scanning is performed from the upper part of the screen such that two lines are scanned simultaneously is 3 H. In the next example, a case will be described in which the gate on period when scanning is performed line by line from the upper part of the screen is the same as the gate on period when scanning is performed from the upper part of the screen such that two lines are scanned simultaneously.

1-4. Third Structural Example of ASG

Figure 9:
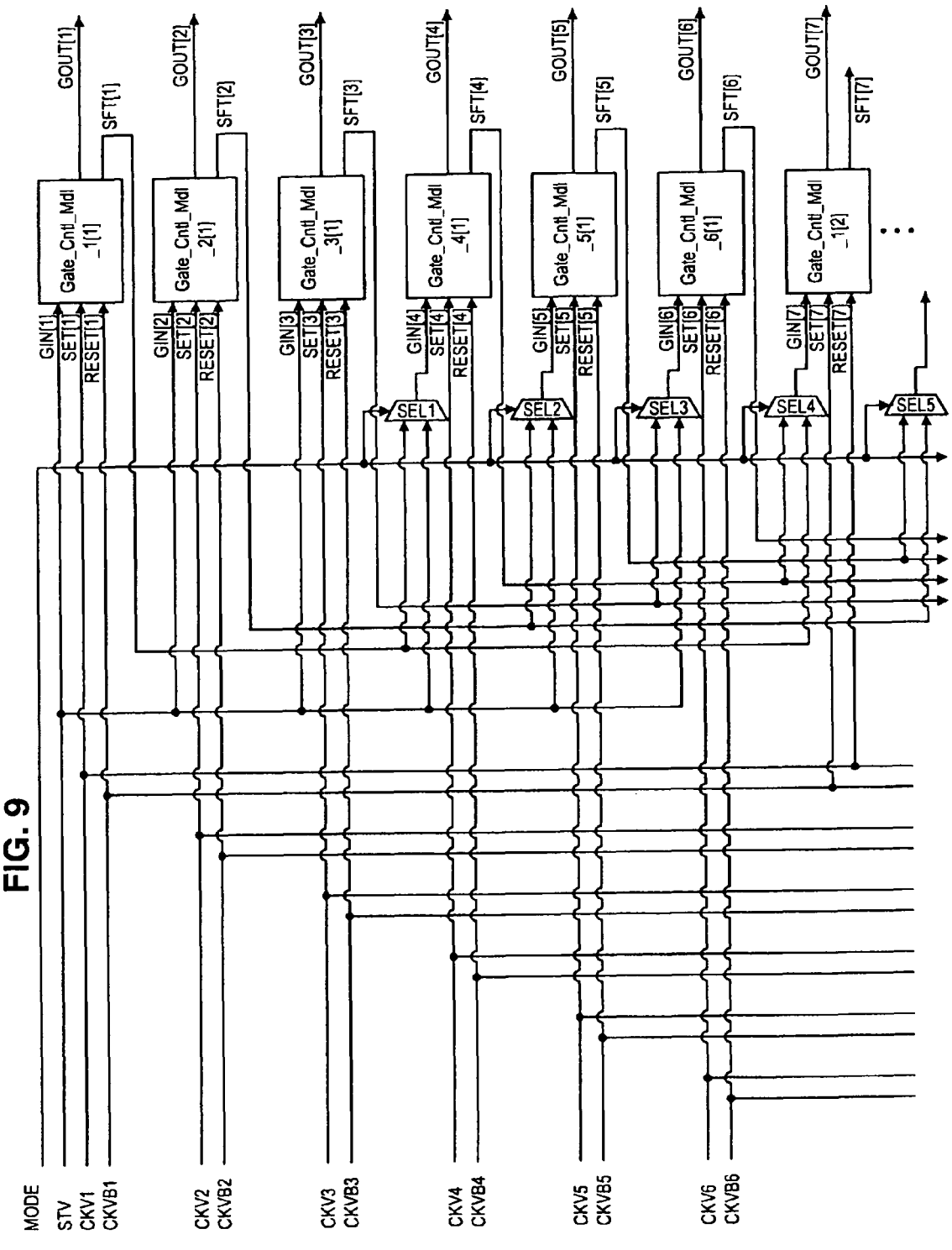
FIG. 9 is an explanatory diagram showing a third structural example of the ASG 152 according to the embodiment of the present invention.

FIG. 9 is an explanatory diagram showing a third structural example of the ASG 152 according to the embodiment of the present invention. Hereinafter, the third structural example of the ASG 152 according to the embodiment of the present invention will be described with reference to FIG. 9.

In a similar manner to FIG. 2 and FIG. 6, in this example, the ASG 152 includes a plurality of gate control circuits Gate_Cntl_Mdl_m [n]. FIG. 9 shows seven gate control circuits (the gate control circuit Gate_Cntl_Mdl_1 [1] to the gate control circuit Gate_Cntl_Mdl_1 [2]). Each of the gate control circuits is a circuit that includes a one stage shift register that drives one gate line, and an output buffer. Each of the gate control circuits is cascade connected at every six cycles to the gate control circuit having the same m value. More specifically, an output of the gate control circuit Gate_Cntl_Mdl_1 [1] is cascade connected to the gate control circuit Gate_Cntl_Mdl_1 [2] that corresponds to the sixth line from the gate control circuit Gate_Cntl_Mdl_1 [1].

In the same manner as each of the gate control circuits Gate_Cntl_Mdl shown in FIG. 2, three types of signals GIN, SET and RESET that are generated by the timing generator 116 are supplied to each of the gate control circuits Gate_Cntl_Mdl shown in FIG. 9. Each of the gate control circuits Gate_Cntl_Mdl outputs two types of signals GOUT and SFT in accordance with the state of the signals GIN, SET and RESET. The signal GOUT is supplied to each gate line, and the signal SFT is supplied as the signal GIN of the gate control circuit of a subsequent stage. The state of the input signals GIN, SET and RESET and the state of the output signals GOUT and SFT are the same as those shown in FIG. 3.

Unlike FIG. 6, in the third structural example shown in FIG. 9, selectors SEL1, SEL2 and the like are provided immediately preceding the input GIN of the gate control circuit Gate_Cntl_Mdl_4 [1] and subsequent circuits. The selectors SEL1, SEL2 and the like are provided to match the gate on period when scanning is performed line by line from the upper part of the screen with the gate on period when scanning is performed from the upper part of the screen such that two lines are scanned simultaneously. The switching of the selectors SEL1, SEL2 and the like is performed in accordance with the state of a signal MODE generated by the timing generator 116. Based on a switching operation of the selectors SEL1, SEL2 and the like, switching is performed such that each of the gate control circuits Gate_Cntl_Mdl is cascade connected to another one of the gate control circuits Gate_Cntl_Mdl at every six circles or at every three cycles.

Figure 10:
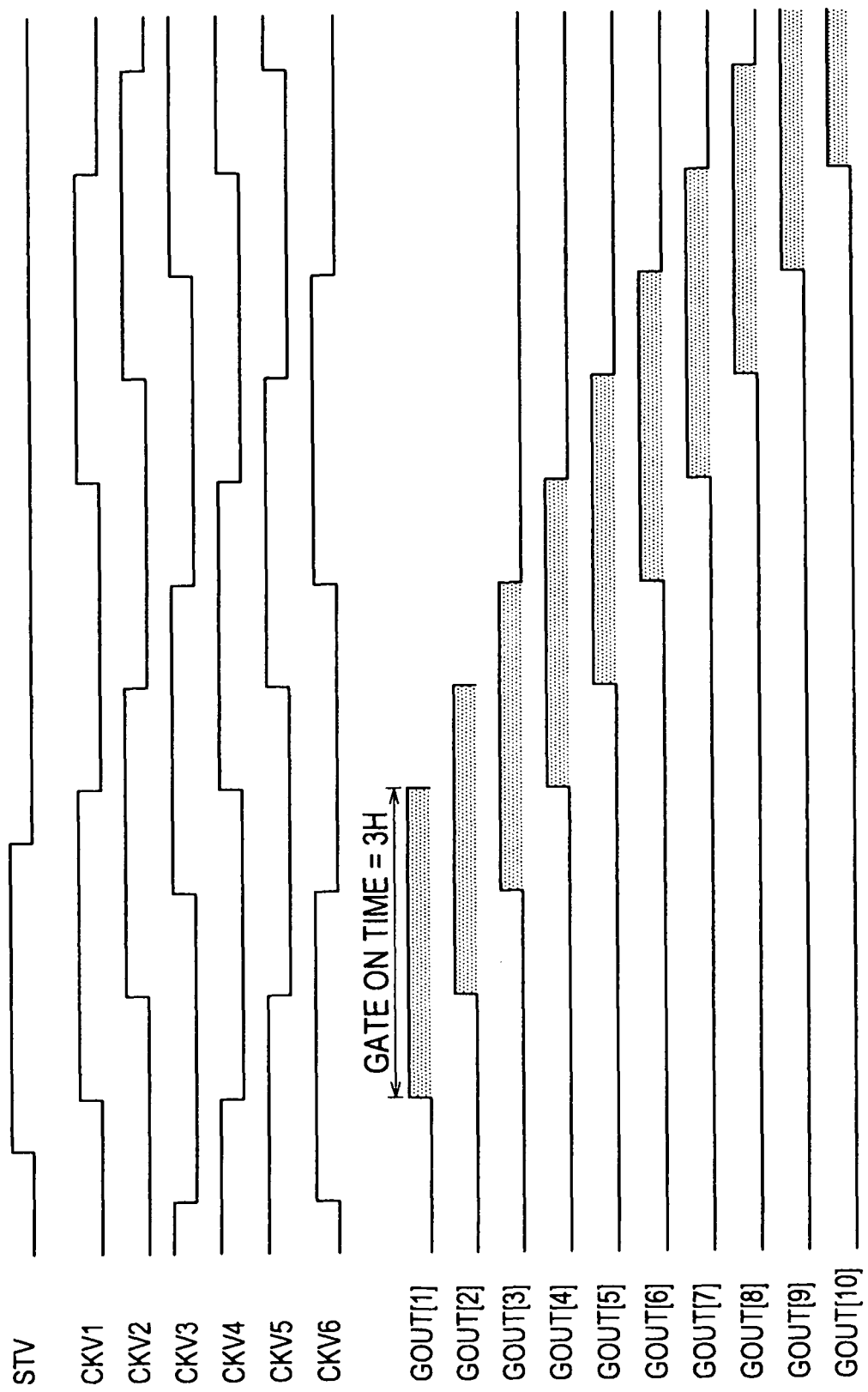
FIG. 10 is an explanatory diagram showing operation timings when scanning is performed line by line from the upper part of the screen.
Figure 11:
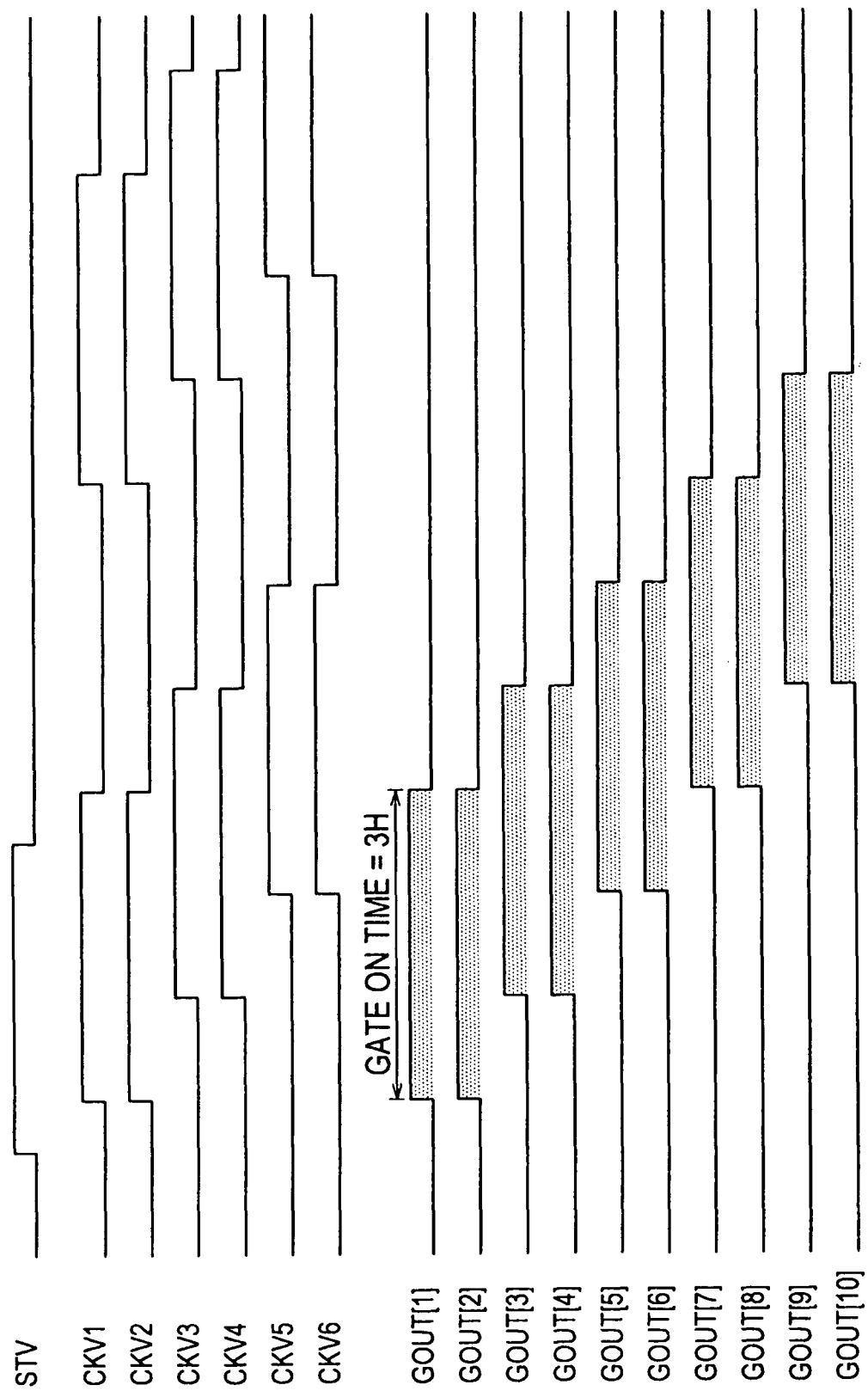
FIG. 11 is an explanatory diagram showing operation timings when scanning is performed from the upper part of the screen such that two lines are scanned simultaneously.

FIG. 10 and FIG. 11 are explanatory diagrams showing operation timings when scanning conditions are respectively changed in the ASG 152 shown in FIG. 9. FIG. 10 is an explanatory diagram showing operation timings when scanning is performed line by line from the upper part of the screen. FIG. 11 is an explanatory diagram showing operation timings when scanning is performed from the upper part of the screen such that two lines are scanned simultaneously. The signals shown in these figures are generated by the timing generator 116 and supplied to the ASG 152.

First, the operation timings when scanning is performed line by line from the upper part of the screen will be described with reference to FIG. 10. The GIN input of the gate control circuit Gate_Cntl_Mdl_1 [1] is connected to STV, the SET [1] input is connected to CKV1, and the RESET [1] input is connected to CKVB1. Note that CKVB1 to CKVB6 supplied to the gate control circuits Gate_Cntl_Mdl are reverse phase signals of CKV1 to CKV6, respectively, and they are omitted in FIG. 10.

When scanning is performed line by line from the upper part of the screen, the level of the signal MODE is made high in the timing generator 116 and the signal MODE is supplied to the ASG 152. When the signal MODE whose level is high is supplied to the selectors SEL1, SEL2 and the like, the selectors SEL1, SEL2 and the like operate to select a path on the upper side in FIG. 9. Therefore, when scanning is performed line by line from the upper part of the screen, if the level of the signal MODE is made high in the timing generator 116 and the signal MODE is supplied to the ASG 152, the gate control circuits Gate_Cntl_Mdl are cascade connected at every three cycles.

In this case, the level of STV supplied from the timing generator 116 is introduced to GOUT [1] and SFT [1] at the rising timing of CKV1, and the level of GOUT [1] and SFT [1] becomes high. After 3 H (a horizontal scanning period) has elapsed, CKV1 falls and CKVB1 rises. At this timing, the level of GOUT [1] becomes low and the gate is turned off. At this time, in the gate control circuit Gate_Cntl_Mdl_1 [2], because CKVB1 is connected to the SET [4] input and SFT [1] is connected to the GIN [4] input, respectively, GOUT [4] and SFT [4] are turned on. At a timing at which CKV1 next rises, because the level of STV is low, the level of SFT [1] becomes low.

A similar operation is sequentially performed also for the gate control circuit Gate_Cntl_Mdl_2 [1], the gate control circuit Gate_Cntl_Mdl_3 [1] and the like, to which CKV2 and CKV3 that rise later than CKV1 are supplied from the timing generator 116. The type of operation shown in FIG. 10 is sequentially performed from the gate control circuit connected to the gate line on the upper part of the screen. Thus, a gate on operation of one horizontal line is sequentially performed with a width corresponding to three horizontal lines.

Next, FIG. 11 is used to explain the operation timings when scanning is performed from the upper part of the screen such that two lines are scanned simultaneously. Note that CKVB1 to CKVB6 supplied to the gate control circuits Gate_Cntl_Mdl are reverse phase signals of CKV1 to CKV6, respectively, and they are omitted in FIG. 11.

When scanning is performed from the upper part of the screen such that two lines are scanned simultaneously, the level of the signal MODE is made low in the timing generator 116 and the signal MODE is supplied to the ASG 152. When the signal MODE whose level is low is supplied to the selectors SEL1, SEL2 and the like, the selectors SEL1, SEL2 and the like operate to select a path on the lower side in FIG. 9. Therefore, when scanning is performed from the upper part of the screen such that two lines are scanned simultaneously, if the level of the signal MODE is made low in the timing generator 116 and the signal MODE is supplied to the ASG 152, the gate control circuits Gate_Cntl_Mdl are cascade connected at every six cycles.

At the rising timing of CKV1, the level of STV is introduced to GOUT [1] and SFT [1], and the level of GOUT [1] and SFT [1] becomes high. The level of STV is introduced to GOUT [2] and SFT [2] at the rising timing of CKV2 that rises at the same time as CKV1, and the level of GOUT [2] and SFT [2] becomes high.

After 3 H from when the level of GOUT [1] and SFT [1] becomes high, the level of GOUT [1] becomes low at the rising timing of CKVB1 and the gate of this line is turned off. Further, in the gate control circuit Gate_Cntl_Mdl_2 [1], the level of GOUT [2] becomes low at the rising timing of CKVB2 and the gate of this line is turned off. After 3 H from this time point, GOUT [1] and GOUT [2] shift to a low state. Due to the shift, writing of image data is completed for these two gate lines. In this manner, the same gate off time is provided for each two horizontal lines. Thus, writing of image data is completed in units of two horizontal lines and it is possible to perform two-line simultaneous scanning.

As shown in FIG. 11, in the third structural example of the ASG 152 according to the embodiment of the present invention, when two-line simultaneous scanning is performed, the gate on period of the odd-numbered line matches the gate on period of the even-numbered line. In the third structural example of the ASG 152 according to the embodiment of the present invention, because a 3 H gate on period is provided, writing of image data is sufficiently possible also on the even-numbered gate lines.

In addition, in the third structural example of the ASG 152 according to the embodiment of the present invention, it is possible to achieve the same gate on period when scanning is performed line by line from the upper part of the screen and when scanning is performed from the upper part of the screen such that two lines are scanned simultaneously. Note that in the third structural example of the ASG 152 according to the embodiment of the present invention shown in FIG. 9, it is necessary to prepare six types of CKV signals in order to achieve the same gate on period when scanning is performed line by line from the upper part of the screen and when scanning is performed from the upper part of the screen such that two lines are scanned simultaneously. In the next example, a case will be described in which the number of signals is reduced, while achieving the same gate on period when scanning is performed line by line from the upper part of the screen and when scanning is performed from the upper part of the screen such that two lines are scanned simultaneously.

1-5. Fourth Structural Example of ASG

Figure 12:
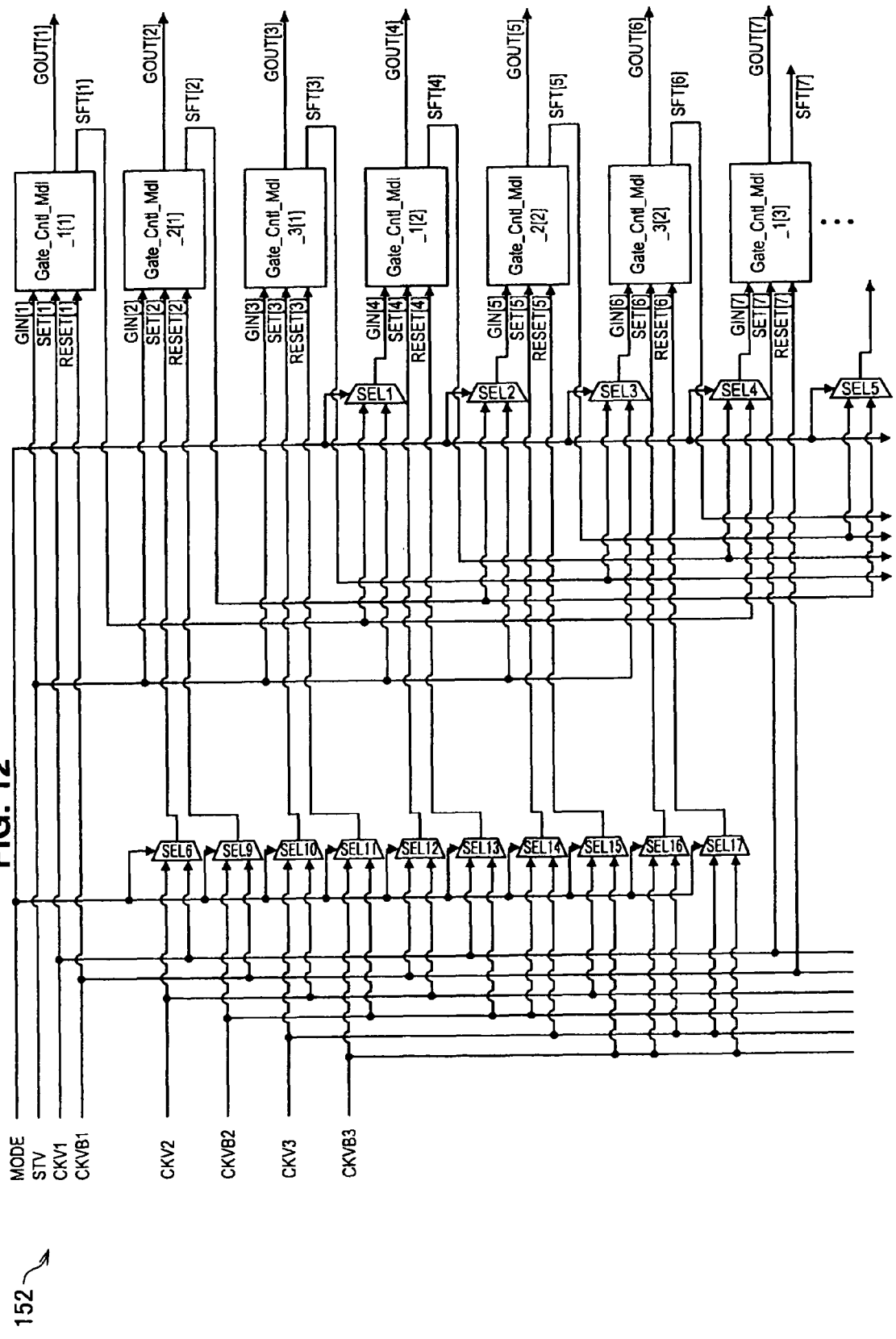
FIG. 12 is an explanatory diagram showing a fourth structural example of the ASG 152 according to the embodiment of the present invention.

FIG. 12 is an explanatory diagram showing a fourth structural example of the ASG 152 according to the embodiment of the present invention. Hereinafter, the fourth structural example of the ASG 152 according to the embodiment of the present invention will be described with reference to FIG. 12.

In a similar manner to the third structural example of the ASG 152 according to the embodiment of the present invention shown in FIG. 9, in the fourth structural example of the ASG 152 according to the embodiment of the present invention, selectors SEL1, SEL2 and the like are provided immediately preceding the input GIN of the gate control circuit Gate_Cntl_Mdl_4 [1] and subsequent circuits. However, in the fourth structural example of the ASG 152 according to the embodiment of the present invention shown in FIG. 12, selectors SEL8 to SEL17 are further provided. The selectors SEL8 to SEL17 are provided to reduce the number of signals in comparison to the third structural example of the ASG 152 according to the embodiment of the present invention shown in FIG. 9. In a similar manner to the selectors SEL1 to SEL5, the selectors SEL8 to SEL17 switch the output in accordance with the level of the signal MODE generated by the timing generator 116.

CKV1 and CKVB1 have a reverse phase relationship, and they are rectangular waves with a duty ratio of 50 percent. In the first to third structural examples, the signals CKVB1, CKVB2 and the like are constantly supplied only to the signal RESET of each of the gate control circuits Gate_Cntl_Mdl. On the other hand, the fourth structural example of the ASG 152 is structured such that the signals CKVB1, CKVB2 and the like can also be supplied to the signal SET of each of the gate control circuits Gate_Cntl_Mdl. Thus, the fourth structural example of the ASG 152 achieves reduction of the number of signals in comparison to the third structural example of the ASG 152 according to the embodiment of the present invention shown in FIG. 9.

Figure 13:
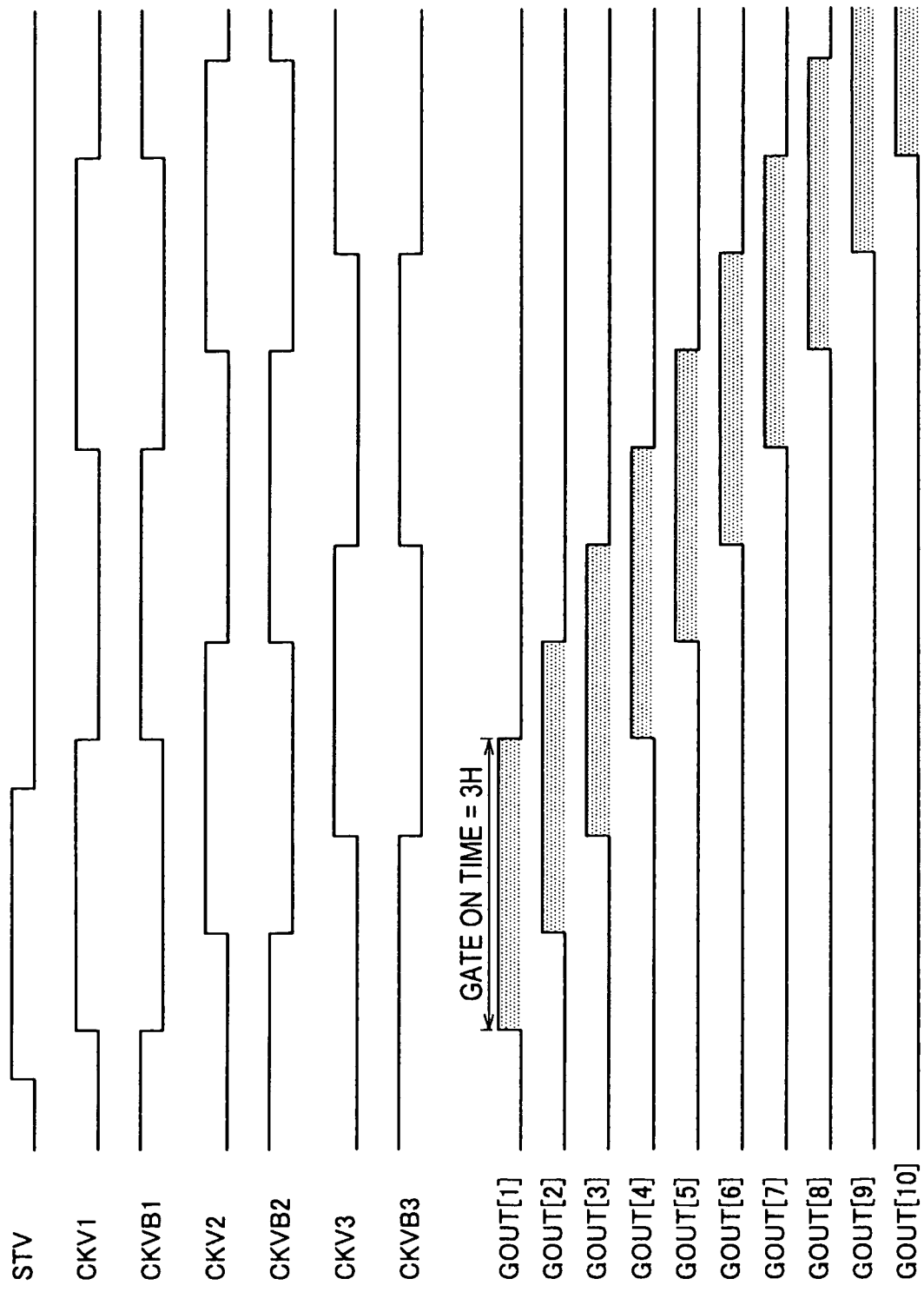
FIG. 13 is an explanatory diagram showing operation timings when scanning is performed line by line from the upper part of the screen.
Figure 14:
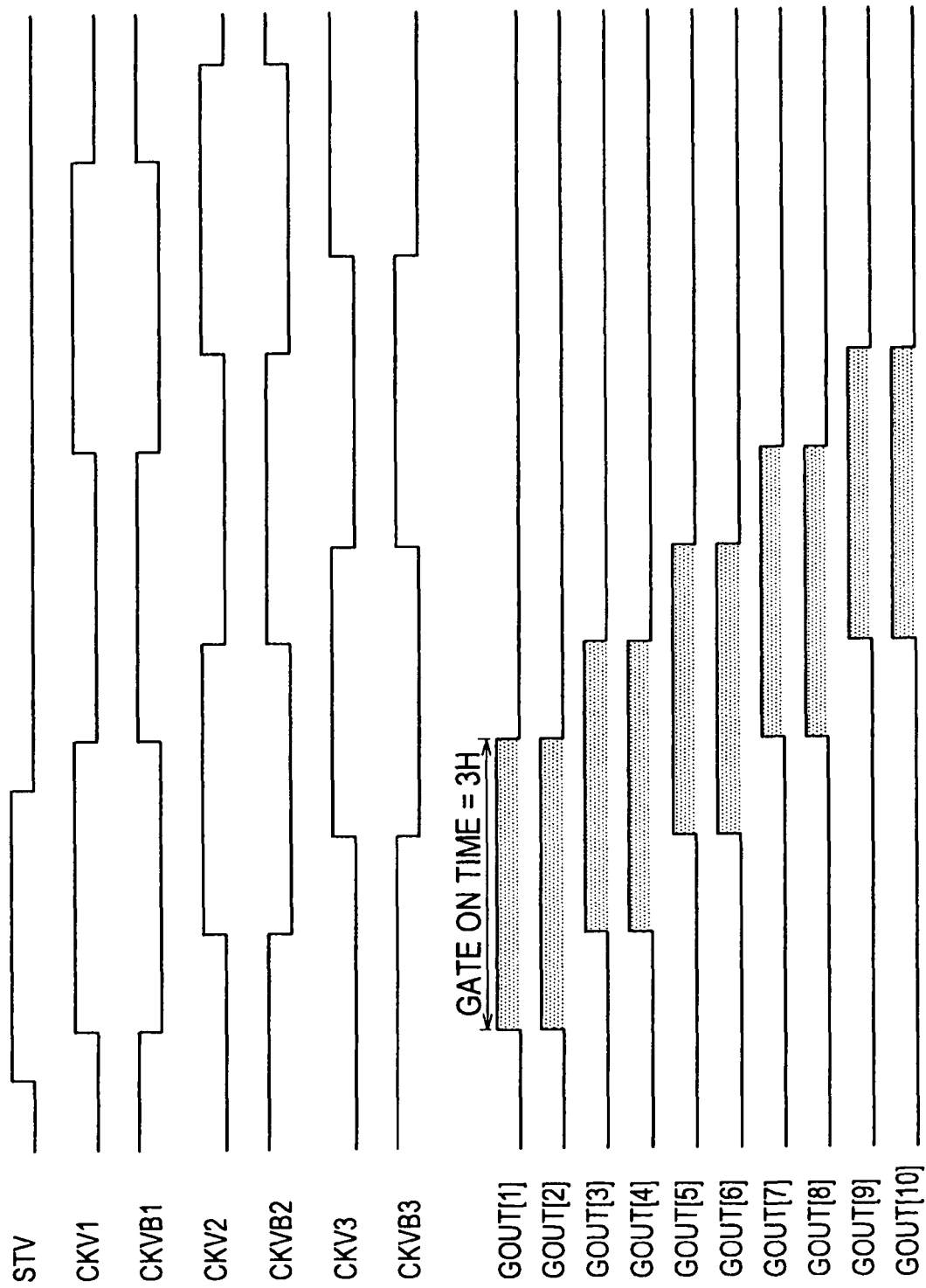
FIG. 14 is an explanatory diagram showing operation timings when scanning is performed from the upper part of the screen such that two lines are scanned simultaneously.

FIG. 13 and FIG. 14 are explanatory diagrams showing operation timings when scanning conditions are respectively changed in the ASG 152 shown in FIG. 12. FIG. 13 shows operation timings when scanning is performed line by line from the upper part of the screen. FIG. 14 shows operation timings when scanning is performed from the upper part of the screen such that two lines are scanned simultaneously.

The signals shown in these figures are generated by the above-described timing generator 116 and supplied to the ASG 152.

First, the operation timings when scanning is performed line by line from the upper part of the screen will be described with reference to FIG. 13. The GIN input of the gate control circuit Gate_Cntl_Mdl_1 [1] is connected to STV, the SET [1] input is connected to CKV1, and the RESET [1] input is connected to CKVB1.

When scanning is performed line by line from the upper part of the screen, the level of the signal MODE is made high in the timing generator 116 and the signal MODE is supplied to the ASG 152. When the signal MODE whose level is high is supplied to the selectors SEL1 to SEL5, the selectors SEL1 to SEL5 operate to select a path on the upper side in FIG. 12. Therefore, when scanning is performed line by line from the upper part of the screen, if the level of the signal MODE is made high in the timing generator 116 and the signal MODE is supplied to the ASG 152, the gate control circuits Gate_Cntl_Mdl are cascade connected at every three cycles.

When the signal MODE whose level is high, which is generated by the timing generator 116, is supplied to the selectors SEL8 to SEL17, the selectors SEL8 to SEL17 operate to select a path on the upper side in FIG. 12.

Accordingly, the signal CKV2 supplied from the timing generator 116 is supplied to the SET [2] input of the gate control circuit Gate_Cntl_Mdl_2 [1], and the signal CKVB2 is supplied to the RESET [2] input of the gate control circuit Gate_Cntl_Mdl_2 [1]. The signal CKVB3 is supplied to the SET [3] input of the gate control circuit Gate_Cntl_Md1_3 [1], and the signal CKVB3 is supplied to the RESET [3] input of the gate control circuit Gate_Cntl_Mdl_3 [1].

Further, the signal CKV1 is supplied to the RESET [4] input of the gate control circuit Gate_Cntl_Mdl_1 [2], and the signal CKVB1 is supplied to the SET [4] input of the gate control circuit Gate_Cntl_Mdl_1 [2]. The signal CKV2 is supplied to the RESET [5] input of the gate control circuit Gate_Cntl_Mdl_2 [2], and the signal CKVB2 is supplied to the SET [5] input of the gate control circuit Gate_Cntl_Mdl_2 [2]. The signal CKV3 is supplied to the RESET [6] input of the gate control circuit Gate_Cntl_Mdl_3 [2], and the signal CKVB3 is supplied to the SET [6] input of the gate control circuit Gate_Cntl_Mdl_3 [2].

In this case, the level of STV is introduced to GOUT [1] and SFT [1] at the rising timing of CKV1, and the level of GOUT [1] and SFT [1] becomes high. After 3 H (a horizontal scanning period) has elapsed, CKV1 falls and CKVB1 rises. At this timing, the level of GOUT [1] becomes low and the gate is turned off. At this time, in the gate control circuit Gate_Cntl_Mdl_1 [2], because CKVB1 is connected to the SET [4] input and SFT [1] is connected to the GIN [4] input, respectively, GOUT [4] and SFT [4] are turned on. At a timing at which CKV1 next rises, because the level of STV is low, the level of SFT [1] becomes low.

A similar operation is sequentially performed also for the gate control circuit Gate_Cntl_Mdl_2 [1], the gate control circuit Gate_Cntl_Mdl_3 [1] and the like, to which CKV2 and CKV3 that rise later than CKV1 are supplied from the timing generator 116. The type of operation shown in FIG. 13 is sequentially performed from the gate control circuit connected to the gate line on the upper part of the screen. Thus, a gate on operation of one horizontal line is sequentially performed with a width corresponding to three horizontal lines.

Next, FIG. 14 is used to explain the operation timings when scanning is performed from the upper part of the screen such that two lines are scanned simultaneously. When scanning is performed from the upper part of the screen such that two lines are scanned simultaneously, the level of the signal MODE is made low in the timing generator 116 and the signal MODE is supplied to the ASG 152. When the signal MODE whose level is low is supplied to the selectors SEL1 to SEL5, the selectors SEL1 to SEL5 operate to select a path on the lower side in FIG. 12. Therefore, when scanning is performed from the upper part of the screen such that two lines are scanned simultaneously, if the level of the signal MODE is made low in the timing generator 116 and the signal MODE is supplied to the ASG 152, the gate control circuits Gate_Cntl_Mdl are cascade connected at every six cycles.

When the signal MODE whose level is low, which is generated by the timing generator 116, is supplied to the selectors SEL8 to SEL17, the selectors SEL8 to SEL17 operate to select a path on the lower side in FIG. 12.

Accordingly, the signal CKV2 is supplied to the RESET [2] input of the gate control circuit Gate_Cntl_Mdl_2 [1], and the signal CKVB2 is supplied to the SET [2] input of the gate control circuit Gate_Cntl_Mdl_2 [1]. The signal CKV3 is supplied to the RESET [3] input of the gate control circuit Gate_Cntl_Mdl_3 [1], and the signal CKVB3 is supplied to the SET [3] input of the gate control circuit Gate_Cntl_Mdl_3 [1].

Further, the signal CKV1 is supplied to the SET [4] input of the gate control circuit Gate_Cntl_Mdl_1 [2], and the signal CKVB1 is supplied to the RESET [4] input of the gate control circuit Gate_Cntl_Mdl_1 [2]. The signal CKV2 is supplied to the SET [5] input of the gate control circuit Gate_Cntl_Mdl_2 [2], and the signal CKVB2 is supplied to the RESET [5] input of the gate control circuit Gate_Cntl_Mdl_2 [2]. The signal CKV3 is supplied to the SET [6] input of the gate control circuit Gate_Cntl_Mdl_3 [2], and the signal CKVB3 is supplied to the RESET [6] input of the gate control circuit Gate_Cntl_Mdl_3 [2].

In this case, the level of STV is introduced to GOUT [1] and SFT [1] at the rising timing of CKV1, and the level of GOUT [1] and SFT [1] becomes high. At the rising timing of CKV2 that rises at the same time as CKV1, the level of STV is introduced to GOUT [2] and SFT [2], and the level of GOUT [2] and SFT [2] becomes high.

After 3 H from when the level of GOUT [1] and SFT [1] becomes high, the level of GOUT [1] becomes low at the rising timing of CKVB1 and the gate of this line is turned off. Further, in the gate control circuit Gate_Cntl_Mdl_2 [1], the level of GOUT [2] becomes low at the rising timing of CKVB2 and the gate of this line is turned off. After 3 H from this time point, GOUT [1] and GOUT [2] shift to a low state. Due to the shift, writing of image data is completed for these two gate lines. In this manner, the same gate off time is provided for each two horizontal lines. Thus, writing of image data is completed in units of two horizontal lines and it is possible to perform two-line simultaneous scanning.

As shown in FIG. 14, in the fourth structural example of the ASG 152 according to the embodiment of the present invention, when two-line simultaneous scanning is performed, the gate on period of the odd-numbered line matches the gate on period of the even-numbered line. In the fourth structural example of the ASG 152 according to the embodiment of the present invention, because a 3 H gate on period is provided, writing of image data is sufficiently possible also on the even-numbered gate lines.

In addition, in the fourth structural example of the ASG 152 according to the embodiment of the present invention, it is possible to achieve the same gate on period when scanning is performed line by line from the upper part of the screen and when scanning is performed from the upper part of the screen such that two lines are scanned simultaneously. When compared to the third structural example of the ASG 152 according to the embodiment of the present invention shown in FIG. 9, it can be seen that the number of signals is reduced, while achieving the same gate on period when scanning is performed line by line from the upper part of the screen and when scanning is performed from the upper part of the screen such that two lines are scanned simultaneously.

1-6. Fifth Structural Example of ASG

Next, a fifth structural example of the ASG 152 according to the embodiment of the present invention will be described. The fifth structural example of the ASG 152 according to the embodiment of the present invention shows a case in which a logic circuit and a selector are provided at the preceding stage of the input of the gate control circuit in order to achieve the same gate on period when scanning is performed line by line from the upper part of the screen and when scanning is performed from the upper part of the screen such that two lines are scanned simultaneously.

Figure 15:
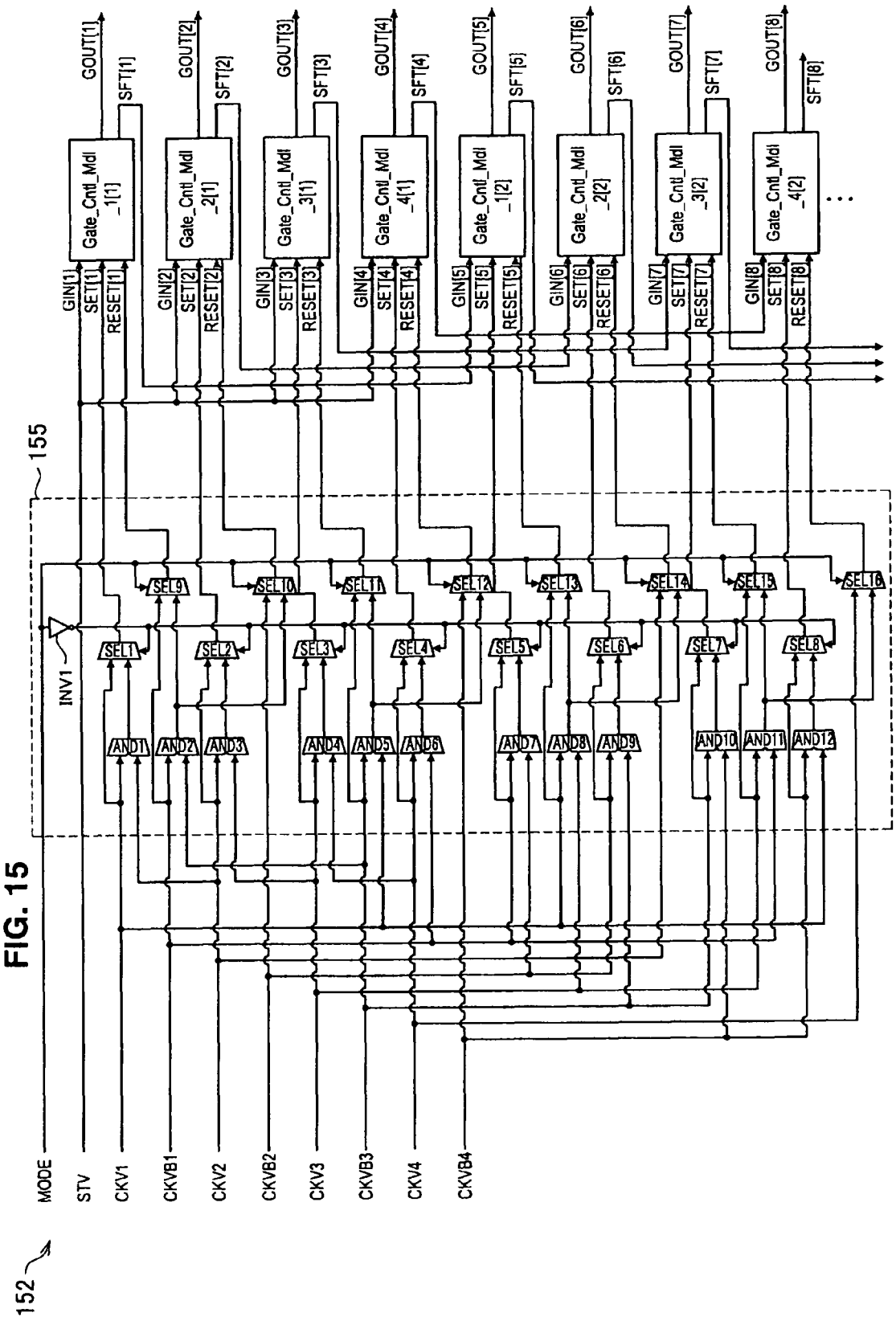
FIG. 15 is an explanatory diagram showing a fifth structural example of the ASG 152 according to the embodiment of the present invention.

FIG. 15 is an explanatory diagram showing the fifth structural example of the ASG 152 according to the embodiment of the present invention. Hereinafter, the fifth structural example of the ASG 152 according to the embodiment of the present invention will be described with reference to FIG. 15.

In a similar manner to the gate control circuits Gate_Cntl_Mdl of each of the above-described structural examples, the gate control circuits Gate_Cntl_Mdl_1 [1] to Gate_Cntl_Mdl_4 [2] shown in FIG. 15 are circuits which each include a one stage shift register that drives one gate line, and an output buffer. Each of the gate control circuits Gate_Cntl_Mdl shown in FIG. 15 is cascade connected at every four cycles to another one of the gate control circuits Gate_Cntl_Mdl.

In the fifth structural example of the ASG 152 according to the embodiment of the present invention shown in FIG. 15, a signal control portion 155 is provided at the preceding stage of the input of the gate control circuit Gate_Cntl_Mdl. The signal control portion 155 includes AND circuits AND1 to AND12, selectors SEL1 to SEL16 and an inverter INV1. The AND circuit AND1 calculates a logical product of the signals CKV1 and CKV2 that are supplied to the ASG 152, and supplies the logical product to the selector SEL1. The AND circuit AND2 calculates a logical product of the signals CKVB1 and CKVB2 that are supplied to the ASG 152, and supplies the logical product to the selectors SEL9 and SEL10. The AND circuits AND1 to AND12 respectively calculate and output the logical product of the combinations of the signals CKV1 to CKV4 and the signals CKVB1 to CKVB4 that are supplied to the ASG 152.

The selectors SEL1 to SEL16 are each supplied with a logical product signal that has passed through one of the AND circuits AND1 to AND12 and a signal that has passed through none of the AND circuits AND1 to AND12. Then, the selectors SEL1 to SEL16 each select one of the supplied signals in accordance with the state of the signal MODE generated by the timing generator 116, and output it. If the selectors SEL1 to SEL16 are provided with a signal whose level is high, the selectors SEL1 to SEL16 operate to select a path on the upper side in FIG. 15.

The inverter INV1 reverses the signal MODE that is generated by the timing generator 116 and supplied to the ASG 152. The signal reversed by the inverter INV1 is supplied to the selectors SEL1 to SEL8.

Figure 16:
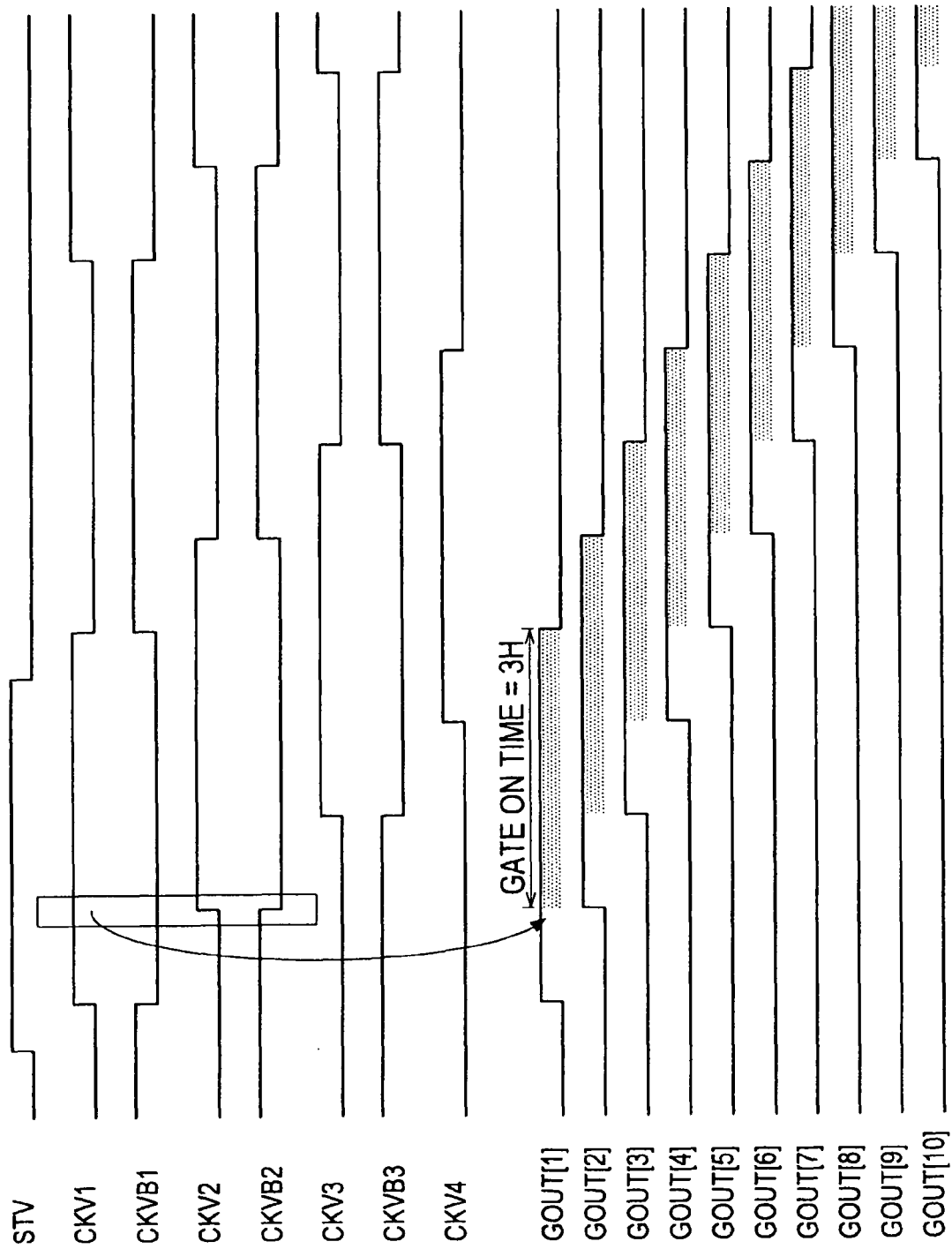
FIG. 16 is an explanatory diagram showing operation timings when scanning is performed line by line from the upper part of the screen.
Figure 17:
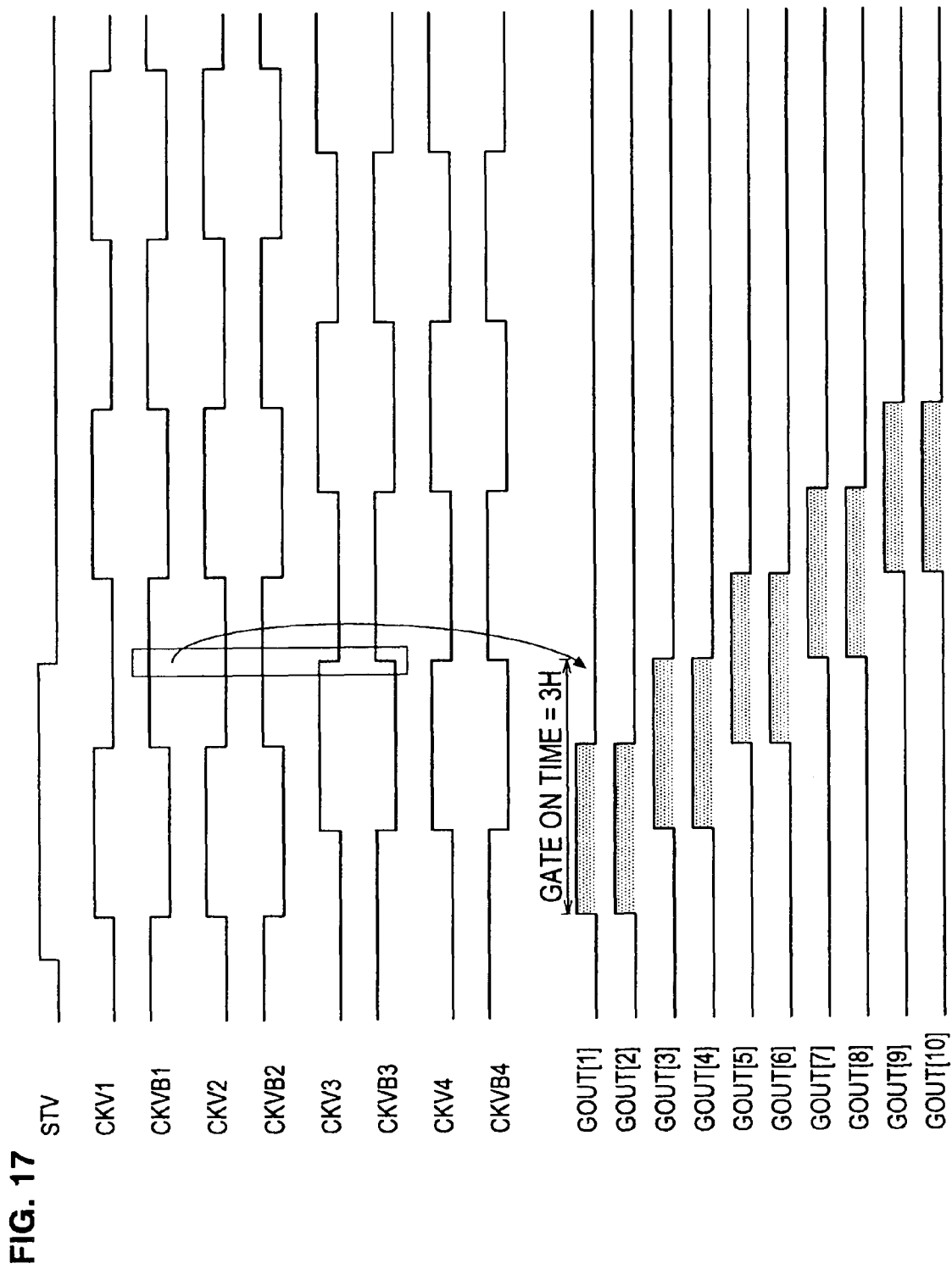
FIG. 17 is an explanatory diagram showing operation timings when scanning is performed from the upper part of the screen such that two lines are scanned simultaneously.

FIG. 16 and FIG. 17 are explanatory diagrams showing operation timings when scanning conditions are respectively changed in the ASG 152 shown in FIG. 15. FIG. 16 shows operation timings when scanning is performed line by line from the upper part of the screen. FIG. 17 shows operation timings when scanning is performed from the upper part of the screen such that two lines are scanned simultaneously. The signals shown in these figures are generated by the above-described timing generator 116 and supplied to the ASG 152.

First, the operation timings when scanning is performed line by line from the upper part of the screen will be described with reference to FIG. 16. When scanning is performed line by line from the upper part of the screen, the level of the signal MODE is made high in the timing generator 116 and the signal MODE is supplied to the ASG 152. The GIN input of the gate control circuit Gate_Cntl_Mdl_1 [1] is connected to STV, the SET [1] input is connected to the output of the selector SEL1, and the RESET [1] input is connected to the output of the selector SEL9.

If the signal control portion 155 in FIG. 15 is not provided, when the level of CKV1 becomes high and the level of CKVB1 becomes low, the level of the signal STV is introduced at this time point, and the level of the output GOUT [1] of the gate control circuit Gate_Cntl_Mdl_1 [1] becomes high. After 4 H has elapsed, the level of CKV1 becomes low and the level of CKVB1 becomes high. As a result, the level of the output GOUT [1] of the gate control circuit Gate_Cntl_Mdl_1 [1] becomes low. Accordingly, if the signal control portion 155 in FIG. 15 is not provided, the ASG 152 shown in FIG. 15 is scanned sequentially from the upper part of the screen, with a gate on width corresponding to 4 H.

However, due to the signal control portion 155 shown in FIG. 15, input timings of the input SET [1] and the input RESET [1] of the gate control circuit Gate_Cntl_Mdl_1 [1] are respectively delayed by 1 H compared to when the signal control portion 155 is not provided. Accordingly, when scanning is performed line by line from the upper part of the screen, the ASG 152 shown in FIG. 15 is scanned sequentially from the upper part of the screen, with a gate on width corresponding to 3 H.

Next, FIG. 17 is used to explain the operation timings when scanning is performed from the upper part of the screen such that two lines are scanned simultaneously. When scanning is performed from the upper part of the screen such that two lines are scanned simultaneously, the level of the signal MODE is made low in the timing generator 116 and the signal MODE is supplied to the ASG 152. The GIN [1] input of the gate control circuit Gate_Cntl_Mdl_1 [1] and the GIN [2] input of the gate control circuit Gate_Cntl_Mdl_2 [1] are connected to STV. The SET [1] input of the gate control circuit Gate_Cntl_Mdl_1 [1] is connected to the output of the selector SEL1, and the RESET [1] input is connected to the output of the selector SEL9. The SET [2] input of the gate control circuit Gate_Cntl_Mdl_2 [1] is connected to the output of the selector SEL2, and the RESET [2] input is connected to the output of the selector SEL10.

If the signal control portion 155 in FIG. 15 is not provided, when the level of CKV1 and CKV2 supplied from the timing generator 116 becomes high and the level of CKVB1 and CKVB2 becomes low, the level of the signal STV is introduced at this time point, and the level of the output GOUT [1] of the gate control circuit Gate_Cntl_Mdl_1 [1] and the level of the output GOUT [2] of the gate control circuit Gate_Cntl_Mdl_2 [1] become high. After 2 H has elapsed, the level of CKV1 and CKV2 becomes low and the level of CKVB1 and CKVB2 becomes high. As a result, the level of the output GOUT [1] of the gate control circuit Gate_Cntl_Mdl_1 [1] and the level of the output GOUT [2] of the gate control circuit Gate_Cntl_Mdl_2 [1] become low. Accordingly, if the signal control portion 155 in FIG. 15 is not provided, the ASG 152 shown in FIG. 15 is scanned sequentially from the upper part of the screen, with a gate on width corresponding to 2 H.

However, due to the signal control portion 155 shown in FIG. 15, a timing at which the level the output GOUT [1] of the gate control circuit Gate_Cntl_Mdl_1 [1] becomes low and a timing at which the level of the output GOUT [2] of the gate control circuit Gate_Cntl_Mdl_2 [1] becomes low are respectively delayed by 1 H compared to when the signal control portion 155 is not provided. Accordingly, when scanning is performed from the upper part of the screen such that two lines are scanned simultaneously, the ASG 152 shown in FIG. 15 is scanned sequentially from the upper part of the screen, with a gate on width corresponding to 3 H.

In this manner, with the provision of the signal control portion 155, when line-by-line scanning is performed, the input timings of the input signals SET and RESET are delayed, and when two-line simultaneous scanning is performed, the shift timing at which the output signal GOUT of each of the gate control circuits shifts to a low level is delayed. Thus, it is possible to achieve the same gate on period when scanning is performed line by line from the upper part of the screen and when scanning is performed from the upper part of the screen such that two lines are scanned simultaneously.

2. Conclusion

As described above, with the liquid crystal display device 100 according to the embodiment of the present invention, when scanning is performed from the upper part of the screen such that two lines are scanned simultaneously, it is possible to ensure that the same gate on period is provided for the two horizontal lines that are scanned simultaneously. In this manner, the gate on characteristics of the adjacent horizontal lines can be made the same. Thus, it is possible to suppress the occurrence of display unevenness in the form of lateral stripes due to a writing difference and writing insufficiency Note that the series of signal processing described above may be performed by hardware or may be performed by software. When the series of signal processing is performed by software, a storage medium that stores a program, for example, may be built into the liquid crystal display device 100. A central processing unit (CPU), a digital signal processor (DSP) or another control device that are built into the liquid crystal display device 100 may read out the program and sequentially execute the program.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
an array substrate comprising pixels arranged in a matrix manner; and
a plurality of gate control circuits that scan gate lines of the pixels that are provided on the array substrate such that each gate control circuit from the plurality of gate control circuits corresponds to a respective gate line of the pixels,
wherein each gate control circuit from the plurality of gate control circuits comprises a first output terminal that outputs a signal to each of the gate lines, and a second output terminal that outputs a signal that is supplied to another gate control circuit from the plurality of gate control circuits wherein a first gate control circuit from the plurality of gate control circuits is cascade connected via the second output terminal to a second gate control circuit, wherein the second gate control circuit corresponds to a gate control circuit at a predetermined number of gate lines from the respective each of the gate control circuits, wherein the predetermined number of gate lines is based on state of a mode signal, and
wherein when two gate lines are scanned simultaneously for writing image data by the signal output from the first output terminal of each of the gate control circuits, a gate on period is provided during which outputs from the first output terminals of two gate control circuits are the same.

2. The display device according to claim 1, wherein the first gate control circuit transfers a level of an input signal from the first output terminal of the first gate control circuit and the second output terminal of the first gate control circuit at a rising edge of a set signal, wherein the output from the first output terminal of the first gate control circuit corresponds to a low level at a rising edge of a reset signal, wherein the each of the gate control circuits comprises a shift register.

3. The display device according to claim 1, wherein the predetermined number of gate lines is equal to or more than a product of a number of lines corresponding to a selection time of each of the gate lines and a number of lines that are simultaneously selected.

4. The display device according to claim 1, wherein the predetermined number of gate lines is an even number.

5. The display device according to claim 1, wherein the predetermined number of gate lines is six stage, wherein the gate on period of each of the gate lines is a width corresponding to 3 horizontal scanning periods when the two gate lines are simultaneously scanned.

6. The display device according to claim 1, further comprising:
a logical circuit comprising:
an AND circuit that calculates and outputs a logical product of set signals and a logical product of reset signals, and
a third selector circuit that switches a supply destination of the signal to each of the gate control circuits such that, when the gate lines are scanned line by line, the logical product of the reset signals is supplied to each of the gate control circuits and, when the two gate lines are scanned simultaneously, the logical product of the set signals is supplied to each of the gate control circuits.

7. The display device according to claim 1, wherein the gate on period is provided during which an output from the first output terminal of each of the gate control circuits are scanned line by line from an upper part of the screen, wherein the signal outputs from the first output terminal of each of the gate control circuits are same during simultaneous scanning of the two gate lines.

8. The display device according to claim 7, further comprising: a first selector circuit that switches a supply destination of the signal from the second output terminal of each of the gate control circuits,
wherein due to the switching performed by the first selector circuit, the gate on period is provided during which the outputs from the first output terminal of each of the gate control circuits are same when the two gate lines are scanned simultaneously.

9. The display device according to claim 8, further comprising:
a second selector circuit that switches a supply destination of the signal that is supplied to each of the gate control circuits, wherein due to the switching performed by the second selector circuit, the gate on period is provided during which the outputs from the first output terminal of each of the gate control circuits are same when the two gate lines are scanned simultaneously.

10. A driving method for a display device, comprising:
in the display device:
outputting, from a first output terminal of each of a plurality of gate control circuits of the display device, a signal having a gate on period during which outputs from first output terminals of two gate control circuits are the same, wherein two lines are scanned simultaneously for writing image data, wherein the plurality of gate control circuits scans gate lines of pixels provided on an array substrate of the display device, wherein a first gate control circuit from the plurality of gate control circuits is cascade connected via the second output terminal to a second gate control circuit from the plurality of gate control circuits, wherein the second gate control circuit corresponds to a gate control circuit at a predetermined number of gate lines from the respective each of the gate control circuits, wherein the predetermined number of gate lines is based on state of a mode signal.

11. The method according to claim 10, further comprising outputting a level of an input signal by each of the gate control circuits from the first output terminal and the second output terminal at a rising edge of a set signal, wherein the output from the first output terminal corresponds to low level at a rising edge of a reset signal.

* * * * *